United States Patent [19]

Eichelberger et al.

[11] Patent Number: 4,835,704

[45] Date of Patent: May 30, 1989

[54] ADAPTIVE LITHOGRAPHY SYSTEM TO PROVIDE HIGH DENSITY INTERCONNECT

[75] Inventors: Charles W. Eichelberger, Schenectady; Robert J. Wojnarowski, Ballston Lake; Kenneth B. Welles, II, Schenectady, all of N.Y.

[73] Assignee: General Electric Company, Schenectady, N.Y.

[21] Appl. No.: 947,461

[22] Filed: Dec. 29, 1986

[51] Int. Cl.$^4$ .............................................. G06F 15/60
[52] U.S. Cl. ............................ 364/490; 148/DIG. 93; 364/559
[58] Field of Search .............. 148/DIG. 93; 204/37.6; 346/762; 364/488, 489, 490, 491, 559; 437/16, 943

[56] References Cited

U.S. PATENT DOCUMENTS

| | | | |
|---|---|---|---|
| 3,290,756 | 12/1966 | Dreyer | 29/155.5 |
| 3,679,941 | 7/1972 | LaCombe et al. | 357/40 |
| 3,691,628 | 9/1972 | Kim et al. | 29/626 X |
| 3,702,025 | 11/1972 | Archer | 29/574 |
| 4,300,153 | 11/1981 | Ilayakawa et al. | 357/80 |
| 4,328,553 | 5/1982 | Fredriksen et al. | 364/559 |
| 4,342,090 | 7/1982 | Caccoma et al. | 364/559 X |
| 4,347,306 | 8/1982 | Takeda et al. | 427/96 |
| 4,426,773 | 1/1984 | Hargis | 29/832 |
| 4,519,876 | 5/1985 | Lee et al. | 204/37.6 X |
| 4,541,712 | 9/1985 | Whitney | 355/46 X |
| 4,550,374 | 10/1985 | Meshman et al. | 364/559 X |
| 4,588,468 | 5/1986 | McGinty et al. | 156/345 |
| 4,613,891 | 9/1986 | Ng et al. | 357/68 |
| 4,617,085 | 10/1986 | Cole et al. | 156/643 |
| 4,628,466 | 12/1986 | Tymes | 364/491 X |
| 4,677,528 | 6/1987 | Miniet | 361/398 |
| 4,723,221 | 2/1988 | Matsuura et al. | 364/559 |
| 4,764,485 | 8/1988 | Loughran et al. | 148/DIG. 93 |

FOREIGN PATENT DOCUMENTS

| | | |
|---|---|---|
| 0010657 | 10/1979 | European Pat. Off. . |
| 0175870 | 12/1981 | European Pat. Off. . |
| 0111128 | 12/1983 | European Pat. Off. . |
| 0178227 | 4/1986 | European Pat. Off. . |
| 0228694 | 12/1986 | European Pat. Off. . |

OTHER PUBLICATIONS

Jubb, Charles, "PC Board Layout Via AutoCaD", *Cadence*, vol. 1, No. 2, pp. 51-55.

(List continued on next page.)

Primary Examiner—Gary Chin
Assistant Examiner—Edward R. Cosimano
Attorney, Agent, or Firm—Robert Ochis; James C. Davis, Jr.; Marvin Snyder

[57] ABSTRACT

An adaptive method and system are disclosed for providing high density interconnections of very large scale integrated circuits on a substrate. The procedure is performed in four basic steps: first an artwork representation for the interconnections of the integrated circuits is generated. This artwork representation is stored in a computer data base and assumes the integrated circuits to be at predetermined ideal locations and positions on the substrate. Second, using imaging, the actual positions of each integrated circuit on the substrate are determined. The actual positions of the integrated circuits are compared with their ideal positions to compute an offset and rotation for each integrated circuit on the substrate. Third, the computed offsets and rotations are then used to modify the artwork representation stored in the data base to account for the actual locations and positions of the integrated circuits on the substrate. Finally, the modified artwork representation is used to drive a direct writing laser lithography system that actually forms the high density interconnections of the integrated circuits on the substrate. The artwork representations are stored in computer data bases in vector form to minimize storage requirements. The laser beam produced by the lithography system is raster scanned on the substrate. Modulation of the laser beam is controlled by the real time conversion of the vector representation of the modified artwork to be a bit mapped representation. To assure accurate formations of the interconnects, a feedback alignment system is used to accurately position the laser beam throughout its raster scan.

14 Claims, 10 Drawing Sheets

OTHER PUBLICATIONS

Angell, Richard, "End-to-End Design", *PC Tech Journal*, vol. 4, No. 11, Nov. 1986, pp. 97-119.

Auletta, L. V. et al., "Flexible Tape Conductor Interconnection for Chips", *IBM Technical Disclosure Bulletin*, vol. 24, No. 2, Jul. 1981, pp. 1214-1215.

*IBM Technical Disclosure Bulletin*, vol. 28, No. 5, Oct. 1985, "Lift-Off Stencil Created by Laser Ablation", p. 2034.

Egitto, F. D. et al., "Plasma Etching of Organic Materials, I. Polyimides in $O_2$-$CF_4$", *Journal of Vacuum Science & Technology*/B3 (1985, May-Jun., No. 3, pp. 893-904.

Lukaszek, W. et al., "CMOS Test Chip Design for Process Problem Debugging and Yield Prediction Experiments", *Solid State Technology*, Mar. 1986, pp. 87-93.

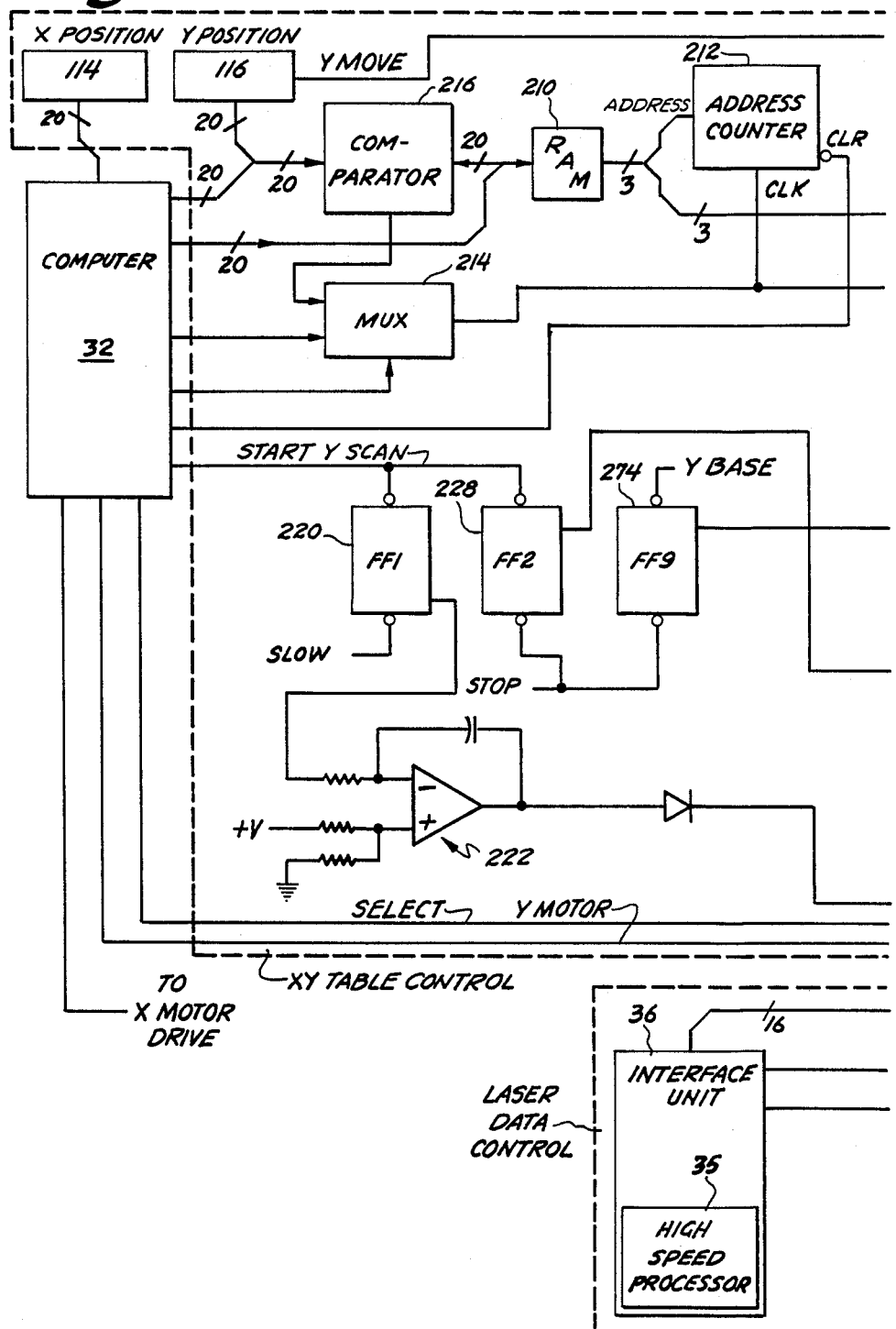
Fig. 3A(1)

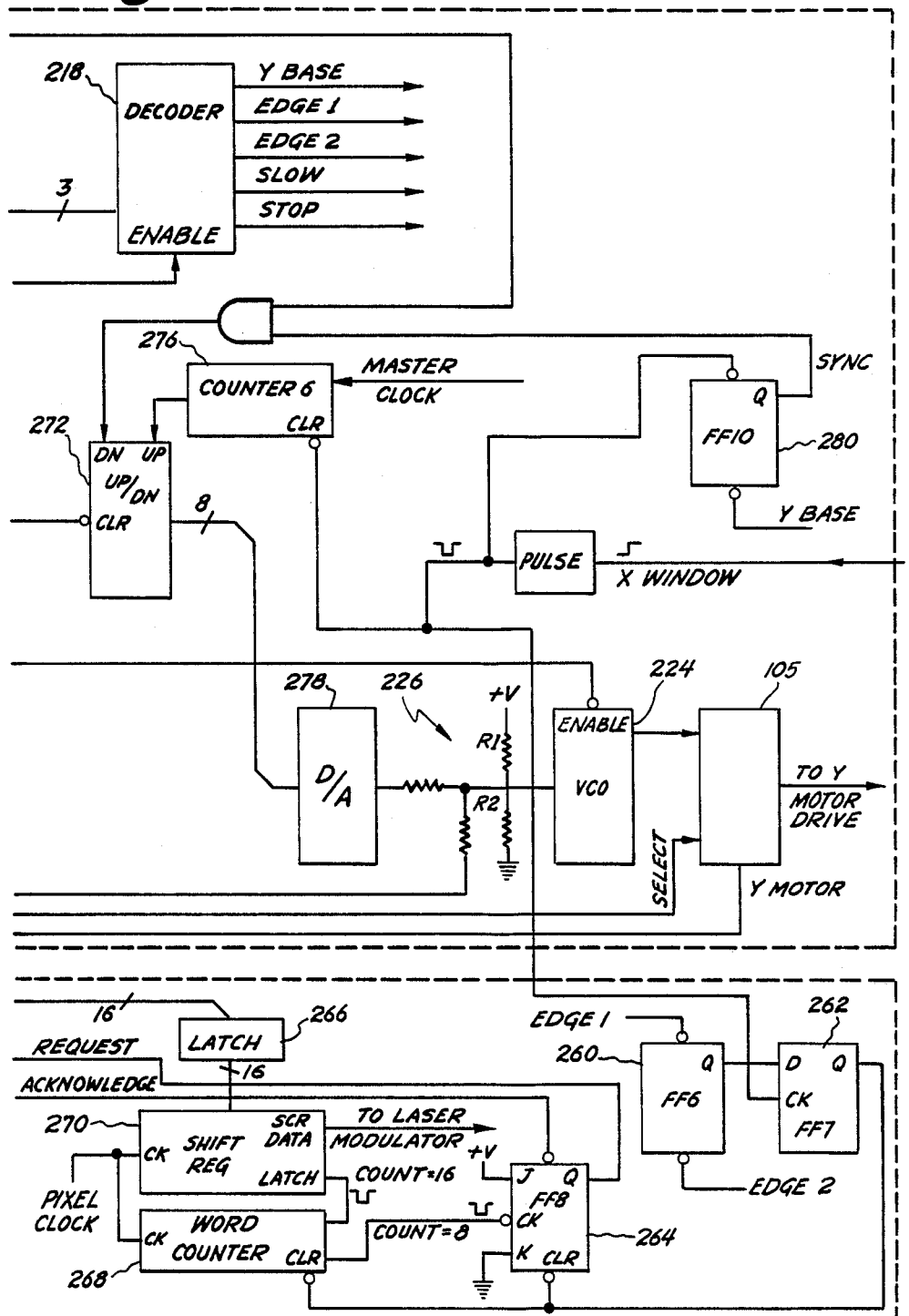
Fig. 3A(2)

ADAPTIVE LITHOGRAPHY SYSTEM TO PROVIDE HIGH DENSITY INTERCONNECT

CROSS REFERENCE TO RELATED APPLICATIONS

This application is related to the following copending applications which are assigned to a common assignee and are incorporated herein by reference:

"Method to Produce Via Holes in Polymer Dielectrics for Multiple Electronic Circuit Chip Packaging", Ser. No. 912,455 filed Sept. 26, 1986 by Charles W. Eichelberger and Robert J. Wojnarowski now U.S. Pat. No. 4,714,516, issued Dec. 22, 1987.

"Integrated Circuit Packaging Configuration for Rapid Customized Design and Unique Test Capability", Ser. No. 912,457 filed Sept. 26, 1986 by Charles W. Eichelberger, Kenneth B. Welles, II and Robert J. Wojnarowski.

"Multichip Integrated Circuit Packaging Configuration and Method", Ser. No. 912,456 filed Sept. 26, 1986 by Charles W. Eichelberger, Robert J. Wojnarowski and Kenneth B. Welles, II allowed June 21, 1988.

"Method and Apparatus for Packaging Integrated Circuit Chips Employing a Polymer Film Overlay Layer", Ser. No. 912,458 filed Sept. 26, 1986 by Charles W. Eichelberger, Robert J. Wojnarowski and Kenneth B. Welles, II.

"Method and Configuration for Testing Electronic Circuits and Integrated Circuit Chips Using a Removable Overlay Layer" Ser. No. 912,454 filed Sept. 26, 1986 by Charles W. Eichelberger, Robjert J. Wojnarowski and Kenneth B. Welles, II. All of the aforementioned applications and the present applications were subject to an obligation of assignment to a common assignee at the times of invention thereof.

BACKGROUND OF THE DISCLOSURE

The subject invention generally relates to a system for directly writing circuit patterns with a focused laser beam and, more particularly, to interconnecting integrated circuit chips which are not accurately placed by first identifying the actual position of each chip and subsequently adapting interconnection and via patterns to conform to the actual chip positions. The term "artwork" is often used and refers to such pattern in the form of a database which describes interconnect structure and via hole structure for providing interconnects between electronic components. The modified artwork provides information to drive a focused laser beam under computer control to directly write circuit patterns in metallization and photo resist. The present invention in related to a packaging system and method in which polymer film overlays are provided with metallization patterns as a means for configuring an integrated circuit chip or chips in an operating arrangement.

The interconnection of pre-packaged circuit chips has been a principal means for the assembly of many electronic systems. In one such method, "the wire wrap method", sockets with wire wrap pins are provided and logic chips to be interconnected are placed in these sockets. Subsequently, interconnections are provided by wrapping wires around wire wrap pins according to a wire list. This can be done by automatic or manual machinery. The major drawback of wire wrap is the length of time required to wrap a single circuit board. This precludes this method from being economic for all but prototyping applications. In addition, wire wrapped boards cannot be checked for accuracy of wiring, both in interconnection accuracy and for shorts, except through the use of expensive, dedicated machinery. Also, wire wrap provides a relatively low performance interconnection since conductor runs are relatively long and since they also suffer from high capacitance loading effects. Also, once chips have been installed on a wire wrap board, it is difficult to partition the board for simple tests. Thus testing to the required high degree of functional assurance generally requires complex and time consuming testing apparatus. Finally, wire wrap prototyping boards are expensive because they contain a large number of holes and each wire wrap socket must supply long pins for wire wrapping.

Printed circuit boards are another method of interconnecting pre-packaged electronic circuit chips. A printed circuit board typically comprises copper runs adhered to an epoxy/glass fiber base substrate or the like. Packaged chips are mounted on the substrate and package pins are soldered to runs on the printed circuit board. In terms of prototyping, the time from completion of the circuit definition until populated boards (that is, boards with chips) are received can be quite long. Layout of printed circuit boards, if done by hand, can require two weeks to a month for a fairly complicated circuit board containing one hundred to two hundred chips. Even with computer aided layout, the amount of computer time required to route the board is substantial for a complicated board. In addition, complicated boards typically require multiple circuit layers which makes design and fabrication of printed circuit boards an even more time consuming process. A typical short turn around time can be on the order of two weeks. In addition, special tooling must be provided in order to test that all the connections are made on the board and that no undesired short circuits exist. At this point it is still necessary to populate the board with chips and to solder them in place. Chip population is generally done in different plant locations than board fabrication because a large number of chips must be kept in inventory and are specific to the needs of a particular operating department, while board fabrication is more generic in nature. The problem of testing the finished assembly is the same as with a wire wrap method in that a fully interconnected assembly generally requires a large array of complex test vectors (sample input patterns designed to exercise particular chip functions) in order to derive a high degree of assurance that the system will work under all desired conditions.

A gate array is also a solution to the problem of providing an electronic chip system. A gate array is primarily a medium to high volume device. In a typical gate array, arrays of P-channel and N-channel transistors are fabricated in an array structure on integrated circuit wafers. These circuits are generally completely fabricated with the exception of the last metallization step. Logic designs are achieved by custom connecting the P-channel and N-channel transistors with the last metallization layer. This method makes relatively efficient use of chip "real estate" and typically utilizes computer aided layout directly from circuit definitions. However, time is required to fabricate masks for the last metallization step and to finish the processing of the wafers. A typical time for the steps of automatic layout, mask generation and chip fabrication is generally at least two weeks. At this point, thousands of chips can be relatively easily fabricated, but thousands of chips are generally not required for prototyping quantities and for many applications. To further complicate the problem, complete systems require custom testing by the vendor of the gate array with the test vectors and conditions developed and supplied by the circuit engineer. This must be done before the chips can be packaged. This means that the circuit engineer must carry out a sufficiently detailed simulation to develop a set of qualification test vectors. Further testing must be accomplished after prototype chips arrive at the circuit engineer's site. While simulation can greatly decrease the risk of design errors in the chips, it does not cover the operation of a chip in an electronic system substantially similar to its operating environment. Generally, faults will be found and updates will be necessary and the requirement for additional prototypes with more changes will be created. This process is both costly and stretches the time to completion of a project substantially because each iteration generally requires at least two weeks. In addition, a single gate array cannot provide all the structures necessary for a complete electronic system. For example, voltages and current may not be compatible at the interface level and may require addition of bipolar devices for analog-to-digital conversion at the input and digital-to-analog conversion at the output. Also, many systems require some form of memory. This means that the gate array would necessarily require an additional printed circuit board to interconnect the memory or interface devices.

A programmable logic array can be used to provide an electronic system economically in low volume for some applications. The major disadvantage of logic arrays is that they make inefficient use of silicon because the logic array must provide for all possible Boolean functions in "AND/OR" configurations. In those few applications where this type of Boolean logic is required, the logic array can be programmed for the desired Boolean functions. Most systems, however, require a large number of logic arrays to achieve the desired function and this is not economical except possibly for the very first prototype.

Fully customized integrated circuits can generally provide about two or three times the functionality available in the same area from a gate array, but the processing cost and non-recurring cost is substantially increased. Circuit layout involves all layers of the chip. Three month turnaround times are typical for the processing associated with a fully custom integrated circuit chip. Test vectors and probe cards are also unique to each application specific integrated circuit (ASIC) situation. This means that substantial number of chips must be involved before the fully custom chip is economical. As a rule of thumb, volumes over ten thousand units per year are generally required.

In the packaging of very large scale integrated (VLSI) circuit devices, a great deal of space is taken up by mechanisms for interconnecting one chip to an adjacent device. This makes the packaging of integrated circuit devices and electronic components based thereon larger than necessary. As a result of this, many individuals are involved in the development of so-called wafer-scale integration processes. However, efforts expended in these directions have generally tended to be limited by the problem of yield. Because a certain number of chips or dies on a wafer are often found to be defective, the number of wafers that are produced that are completely usable is generally lower than is desired. Furthermore, there still exists the problem of interconnecting the various chips on a wafer and the concomitant problem of testing a large system, such as results when a number of highly complicated individual integrated circuit components are interconnected. Accordingly, it would be very desirable to be able to construct wafer scale integrated circuit packages from individual, easily testable integrated circuit chips. It is to this end that the present invention is directed.

The invention described herein also solves a slightly different problem with the same method and structure used to solve the wafer-scale integration problem. In present day electronic systems, the primary components are usually readily available. These components include random access memory (RAM) and microprocessor chip family sets as well as analog-to-digital and digitial-to-analog conversion chips. In present day systems, these primary components are interconnected using transistor-transistor logic (TTL). TTL logic refers to a set of functional blocks generally referred to as the 7400 series and is described in the handbook *The TTL Data Book for Design Engineers* published by Texas Instruments, Inc. This function of interconnecting, buffering and tying together the primary components of the system is generally referred to as a "glue logic function". For example, in present day integrated circuit boards, one often finds certain standard functional chips surrounded by a plurality of custom interconnected integrated circuit chips in familiar dual in-line packages (DIP packaging). It is these numerous small surrounding chips that provide a "glue function". In future systems, the glue logic function may be provided by gate arrays and custom chips where a single chip replaces a large number of TTL chips. This leads to several problems. The first is that the number of pins in the custom glue chip can be quite high. In addition, all of the primary components are immediately available. In the past, TTL was also immediately available and system interconnection could commence immediately on receipt of a given design. However, a time discontinuity now exists in which the primary components are available, but the custom glue logic takes many weeks to fabricate. The invention described in copending application Ser. No. 912,457, entitled "Integrated Circuit Packaging Configuration for Rapid Customized Design and Unique Test Capability" uses a generic glue logic chip which can be used in place of a large number of TTL logic chip.

In a different process seeking to achieve some of the same objectives as the present invention, semiconductor chips are mounted on a substrate, and a layer of material such as polytetrafluoroethylene (PTFE) is pressed over the tops of the chips and around the chips so that the chips are completely encapsulated in this layer. Holes are etched in the encapsulating layer corresponding to pad positions on the chips. Metallization is applied and patterned to form interconnections. However, the present invention is significantly different from such processes for the following reasons. In the process just described, known as semiconductor thermodielectric processing (STP), the chips are completely embedded in PTFE material so that no overlay layer as such exists. This makes it impossible to repair an assembly since the chips cannot be removed. Even if a chip could be removed, the remaining chips would still be encapsulated in the PTFE material and there would be no way to install a replacement chip. In addition, there is no provision in the semiconductor thermodielectric processing method for a removable metallization layer which is selectively etched, thus protecting the underlying circuit while assuring complete removal of the metallization layer. In addition, the semiconductor thermodielectric processing method faces two other problems. First, by encapsulating chips in a polymer, a high degree of stress is created by difference in thermal expansion coefficients. Second, the thickness of the polymer over the top of the chips is governed solely by the thickness of the chip and the tooling which encapsulates the chips. Variations in chip thickness lead to variations in the thickness of the polymer over the chip.

As described in more detail in, for example, copending applications Ser. No. 912,456, entitled "Multichip Integrated Circuit Packaging Configuration and Method" and Ser. No. 912,458, entitled "Method and Apparatus for Packaging Integrated Circuit Chips Employing a Polymer Film Overlay Layer", a multichip integrated circuit package is produced by arranging a plurality of individual integrated circuit chips on a common substrate and then covering the chips on the substrate with a polymer film overlay layer or layers. The via holes are formed and metallized interconnections between the pads of the individual chips are provided. However, by itself, this packaging technique is highly dependent on the precise and accurate placement of the chips on the substrate. What is needed, especially for automated packaging of integrated circuit chips, is a procedure which is less dependent on the highly accurate placement of the chips on the substrate.

In one embodiment of the present invention, a polymer film covers a plurality of integrated circuit chips adjacent to one another on an underlying substrate. Furthermore, the polymer film provides an insulative layer upon which a metallization pattern for interconnection of individual circuit chips is eventually deposited. The method of disposing a polymer film over a plurality of integrated circuit chips affixed to an underlying substrate is described in copending application Ser. No. 912,458, entitled "Method and Apparatus for Packaging Integrated Circuit Chips Employing a Polymer Film Overlay Layer". The invention disclosed therein solves significant problems with respect to high temperature processing and the requirement for excellent compliance of a plastic material to an irregular surface. The chips include interconnection pads for connecting to other integrated circuit components or for connecting to other parts of the same chip. Via openings or apertures in the polymer dielectric layer are aligned with the interconnection pads. The pattern of interconnection conductor is disposed on the overlying polymer film so as to extend between at least some of the via openings so as to provide electrical connections between various parts of a chip or between several chips. The method for producing via holes in polymer dielectrics for multiple electronic circuit chip packaging is described in copending application Ser. No. 912,455, now U.S. Pat. No. 4,714,516, issued Dec. 22, 1987 and entitled "Method to Produce Via Holes in Polymer Dielectrics for Multiple Electronic Circuit Chip Packaging".

Metallization is preferably provided by sputtering a one thousand angstrom thick layer of titanium, followed by a one micron thick layer of copper over the polymer film and into the via holes. The metallization is preferably patterned by spraying or spinning a coating of photoresist on the copper surface, drying for about one half hour at approximately 90° C. and exposing the positive resist material with a scanned ultraviolet (UV) laser beam under control of computerized artwork. A preferable photoresist material is Dynachem OFPR 800 photoresist.

To maximize the operating speed of the final system, interconnection from one chip to another is preferably accomplished with a minimum of capacitative loading and a minimum of interconnect length. Capacitative loading tends to slow down signal transmission such that high speeds attained on the chip cannot be maintained in communicating from one chip to another. Interconnection length between chips also contributes to propagation delay due to greater capacitative loading effects in the dielectric medium due to circuit length and also due to a self inductance of the interconnection circuit. The metallization is patterned to form very fine lines and spaces, typically under 1 mil in line width and 1 mil in line spacing. Copending application Ser. No. 912,456, entitled "Multichip Integrated Circuit Packaging Configuration and Method" describes the ability to interconnect chips placed edge to edge because the metallization pitch is much finer than the pad spacing.

The lithography system adapts to inaccurately placed chips by modifying database artwork patterns representing an ideal interconnect pattern so as to accommodate the actual position of integrated circuit chips. Commercially available chip placement devices are not sufficiently accurate to position chips with the resolution capability of a laser scan system. In accordance with this invention, a method is disclosed for modifying artwork representing an ideal interconnect pattern to accommodate the actual position of the integrated circuit chips. The four major steps required are: generating artwork patterns for the ideal case, determining the actual positions of each integrated circuit component, modifying the artwork to match the actual chip positions, and using the modified artwork to produce the desired effects in an adaptive lithography scanning system.

Artwork is generated for the ideal positioning of integrated circuit chips using a computer-aided layout system. This computer-aided design system is provided with a first data base containing information as to the integrated circuit chips size, their ideal position and orientation if that is user specified, the location of connection pads on each integrated circuit chip and a list of the required connections among the various connection pads on the various integrated circuit chips. The computer-aided design system then provides a layout for the chips on the substrate and the printed circuit metallized conducting paths in the form of a second data base. The various conducting paths may preferably be stored in vector form as a series of straight line segments each specified by its starting and ending points. All interconnect, via hole definitions, and chip boundary definitions are stored in a file. The chip boundary definitions include an outline of a chip including its ideal position and orientation and an outline of the extent to which the chip can be misplaced. The actual positions and orientation of the integrated circuit components are determined from connection pad and chip outline information. Ideally, this process is performed automatically by using a charge-injection device (CID) camera and an image recognition technique to align each circuit chip and calculate offset and rotation information. In the process actually implemented and described hereinafter, the process is partly manual. More specifically, the substrate is aligned on the x-y table in both location and rotation according to fiducial marks on the substrate.

The monitor for the CID camera is equipped with a bull's-eye or cross-hair pattern on the center of the screen. When the fiducial mark on the substrate which corresponds to the mirror zero position is near the bull's eye, the x and y position counters are reset to zero. The computer then supplies pulses to x and y stepping motors to step to the ideal position of the upper right hand pad of the integrated circuit chip. A mouse connected to the computer is used to move the image of one pad of the actual chip directly under the cross-hairs. The difference between the actual position and the ideal position is recorded. Then the computer steps the x-y table to the expected position of a pad on the opposite side of the integrated circuit chip, making the assumption that the chip is not rotated from the ideal position. The mouse is used again to position the image of the actual pad directly under the cross hairs. Again, the difference between the actual position and the ideal position is recorded. The offset and rotation of the actual chip is then recorded from the results of the two operations. The computer then goes to the next chip in sequence and determines its offset and rotation and this process is repeated until the offset and rotation of all the chips have been recorded. The information determined during this step is stored in a database which defines the chip positions. The ideal artwork is modified to match the actual chip position. All of the interconnect patterns and associated via holes are modified to incorporate the offset and rotation associated with each integrated circuit chip. The modified artwork is used to drive the adaptive lithography scanning system. The modified artwork is used to supply the commands for positioning the x-y table and to supply data to the high speed processor for driving the adaptive lithography scanning system and for modulating the laser beam so that a modified printed circuit pattern can be printed on the substrate.

The structure of the adaptive lithography system includes a primary laser beam path which starts from an Argon ion laser which is adjusted with optics to provide ultraviolet (UV) output. The laser provides a single beam which may be divided, with beam splitting optics, into as many beams as are required. The laser beam is then passed through an acousto-optical modulator which deflects the beam when a high frequency signal is applied. A plate with an aperture is positioned approximately one meter from the output of the modulator. The non-deflected beam is stopped by the plate and the deflected beam passes through the aperture.

The deflected beam is expanded to the desired diameter laser beam with a beam expander. The expanded beam is directed to a galvanometer driven scanner which has a (9-millimeter) diameter scanning mirror and an internal sensor which is coupled with a servo-amplifier to accurately position the mirror. The scanned beam is focused onto a substrate with a conventional plano-convex lens. A second laser is used to accurately determine the position of the scanning mirror at all times during the scan. The second laser beam is passed through a graticule and focused on a PIN diode detector.

A CID camera with a microscope objective is mounted to observe the area on the substrate where the laser beam focuses. Precise correlation between the laser beam position and the image of the CID camera is obtained. The substrate is positioned on a precision x-y table, which is positioned by precision screws attached to separate motors. The CID camera is connected to a video subsystem which drives a television display.

A microcomputer, such as a MS-DOS personal computer (PC), manages the process and dataflow. An input/output board connects special control electronics which manage the motion of the x-y table to the PC. The image data from the CID camera is sent through an interface board to a high speed processor which generates bit map patterns of the artwork stored in vector form. The control electronics for the adaptive lithography system can be divided into three major sections which are: x-y table control, mirror scan control, and laser data control. Circuitry is included which assures that the x-y table is in exact synchronism with the position of the scanning mirror. The lithography system operates by converting a file stored in rectangular vector form to a controlled flow of data which modulates a laser beam in synchronism with its position on the substrate to be exposed.

The system can be expanded to achieve higher throughput rates at a substantial savings by duplicating only essential parts of the device. The system can be duplicated as many times as required to obtain the desired throughput rate. The acousto-optic modulator, the expander, the scanner, and the focus lens as well as the alignment laser and the graticule must be duplicated. The x-y table, the CID camera, the PC, the laser and other equipment need not be duplicated.

The adaptive lithography system according to the present invention is particularly attractive because it requires few processing steps. Also, the time to produce photomasks and the yield and deterioration problems are eliminated. If desired, the direct writing system is able to customize each circuit produced.

SUMMARY OF THE INVENTION

It is therefore a general object of this invention to provide a direct writing lithography system for direct laser exposure of positive or negative photoresist.

It is another object of the invention to provide a direct writing lithography system which can provide commercial through-put rates but which exposes photoresist at allowable power densities.

It is a further, more specific object of the present invention to provide a direct writing lithography system which can accommodate the interconnection of chips with an accuracy which is an order of magnitude higher than chip placement accuracy.

It is a still further object of the invention to provide a system which can easily produce customized devices.

It is a still further object of the present invention to provide a direct writing lithography system which requires a minimum of memory to store the image data by computing, in real time, an image-vector-data-base to bit-map conversion.

It is a still further object of the invention to provide a direct writing lithography system which achieves higher resolution than implied by scanning mirror drift and jitter.

Lastly, but not limited hereto, it is a still further object of the invention to provide a direct writing lithography system which incorporates acceleration and deceleration of an x-y table, along with speed and position control such that continuous table motion can be obtained with higher accuracy than available from commercial grade table screws.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 3A and 3B are circuit diagrams for the control electronics;

DETAILED DESCRIPTION OF THE INVENTION

Copending application Ser. No. 06/912,458, entitled "Method and Apparatus for Packaging Integrated Circuit Chips Employing a Polymer Film Overlay Layer" describes a method and apparatus for applying removable polymer overlay layer. Copending application Ser. No. 06/912,455 now U.S. Pat. No. 4,714,516, issued Dec. 22, 1987 and entitled "Method to Produce Via Holes in Polymer Dielectrics for Multiple Electronic Circuit Chip Packaging" describes a preferred method for supplying the overlay layer with a pattern of apertures for connection to interconnect pads located on integrated circuit chips. Copending allowed application Ser. No. 06/912,456, entitled "Multichip Integrated Circuit Packaging Configuration and Method" describes a method for providing a preferred form of metallization patterning over a polymer film. Details of a preferred laser exposure system are disclosed in copending application Ser. No. 06/912,455, now U.S. Pat. No. 4,714,516, issued Dec. 22, 1987, and entitled "Method to Produce Via Holes in Polymer Dielectrics for Multiple Electronic Circuit Chip Packaging".

Figure 1:
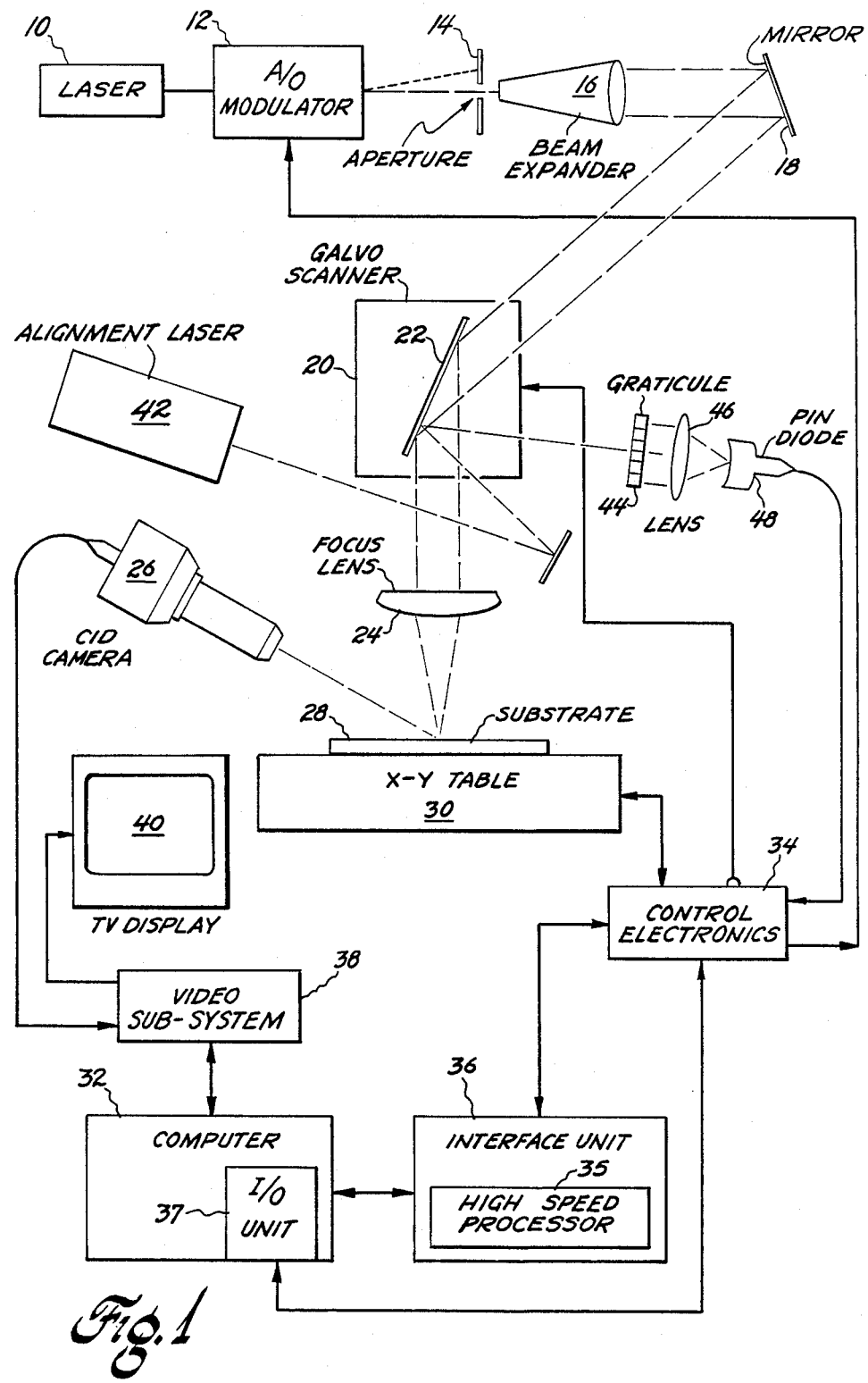
FIG. 1 is a block diagram of an adaptive lithography system in accordance with the present invention.

Referring now to the drawings and, more particularly, to FIG. 1, a laser 10 such as an Argon ion laser is adjusted with optics for an output of approximately 0.4 watt in the ultraviolet (UV) range. Laser 10 may be a Spectra Physics 2505 unit. The laser beam is passed through acousto-optical modulator (A/O) 12 to plate 14 with an aperture. The modulator deflects the beam when a high frequency signal is applied to the modulator. Acousto-optical modulator 12 may be a Newport Optics Systems Quartz Modulator. An undeflected beam is stopped by plate 14 positioned approximately one meter from acousto-optical modulator 12, while a deflected beam passes through the aperture to beam expander 16 which expands the laser beam in accordance with the diffraction limits to achieve a desired eight micron focussed laser spot. The beam expander used may be an Oriel Model 1510. UV-grade aluminum coated mirror 18 is used to deflect the expanded beam into proper alignment with galvanometer driven scanner 20. The scanner used may be a General Scanning 120 D.C. galvanometer scanner. Scanner 20 preferably has a nine millimeter diameter scanning mirror 22 and an internal sensor which can be coupled with a servo-amplifier for accurate positioning. The scanned beam is focused with plano-convex lens 24 having a focal length of one hundred millimeters onto substrate 28. CID camera 26 with a microscope objective is mounted to observe the area on substrate 28 where the laser beam is focussed. The CID camera used may be a General Electric Model TN 2505A2. Substrate 28 is placed on precision x-y table 30 which is positioned by precision screws 102 (shown in FIG. 2), attached to separate motors 103 and 104 (also shown FIG. 2). Precision x-y table 30 may be the type supplied by New England Affiliated Technologies. Computer 32 manages the dataflow in the adaptive lithography system. The computer used may be an IBM PC/XT. Control electronics 34 which control the motion of x-y table 30 are connected to computer 32 by input/output board 37. Input/output board 37 may be of the type made by Techmar. Interface board 36 interfaces high speed processor 35 with computer 32. Interface board 36 may be a Sky 320 PC board made by Sky Computers of Lowell, Mass., which contains high speed processor 35 chip, such as TMS 320-10 chip made by Texas Instruments. High speed processor 35 is used to generate bit map patterns from artwork stored in vector form and to process image data from CID camera 26. CID camera 26 is connected to video subsystem 38 which drives television display 40 and communicates with computer 32. Video subsystem 38 used may be a Data Translation DT2803 unit. The position of scanning mirror 22 is accurately determined with the use of an alignment laser 42. Alignment laser 42 may, for example, comprise a 0.5 milliwatt helium neon laser from Spectra Physics. Alignment laser 42 emits a beam which is deflected by scanning mirror 22 and passed through graticule 44. The beam is then focussed by a lens 46 onto PIN diode detector 48.

Figure 2:
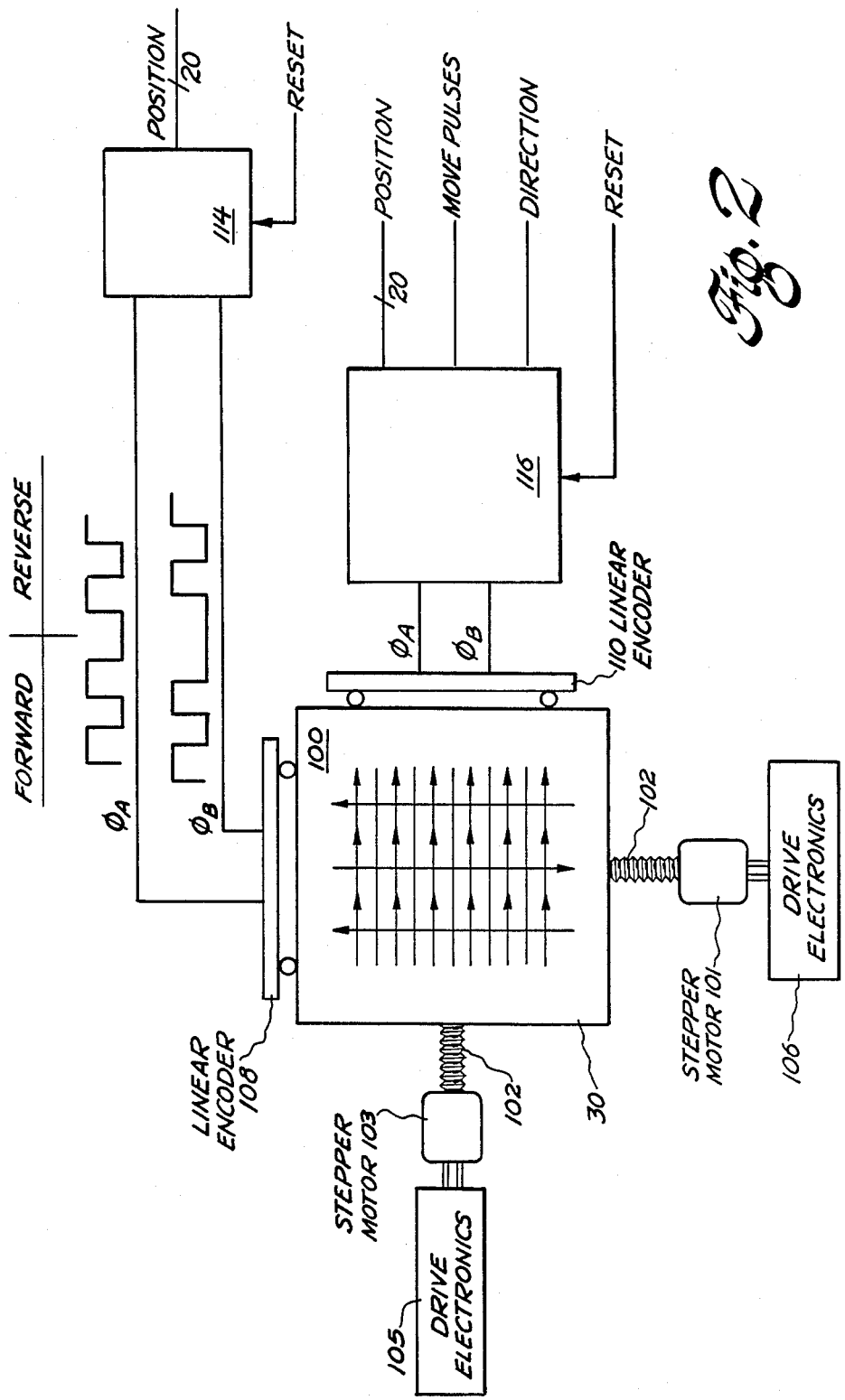
FIG. 2 is a block diagram of an x-y table drive and position sensor.

FIG. 2 shows details of the x-y table drive and position sensing, as well as a map of raster scan pattern 100 traced by the beam from laser 10. Separate stepper motors 103 and 104 drive precision screws 102 to position x-y table 30. Drive electronics 105 and 106 receive pulsed information from control circuitry 114 and 116 and then translate the information into stepping x-y table 30 by stepper motors 103 and 104 to the desired location. Linear encoders 108 and 110 attached to the edges of x-y table 30 encode the table position to a resolution of one micron with a standard format two-phase, ninety degree square wave pattern 112. Phase A ($\phi_A$) always transitions before phase ($\phi_B$)B. Circuitry 114 and 116 decode the motion and direction of motion of the table 30. Circuits which can detect motion and direction of motion are well known in the art. For example, Bausch and Lomb supplies a decoding circuit for use with their linear scales which features digital readout in microinches and microns called the Accurite Quick Count II. An up/down counter provides a binary value which corresponds to the number of microns moved. A reset signal is used to zero the up/down counter and, thereby, to establish a reference point. After zeroing, all positions are measured relative to the position of the x-y table 30 where the up/down counter was reset. The scanning mirror scans back and forth deflecting the laser beam on the x-axis in a saw tooth pattern; that is, the scan progresses from left to right for a period of approximately one and a half milliseconds, then quickly returns to the left most position in half a millisecond. Each scan covers a distance of approximately six millimeters. As the laser is scanned in a direction on the x-axis by scanning mirror 22, table 30 is moved at a constant speed in a direction on the y-axis. When the laser beam reaches the edge of x-y table 30, x-y table 30 is moved to the right six millimeters and then begins to move at a constant rate in the opposite direction on the y-axis.

Figure 3B:
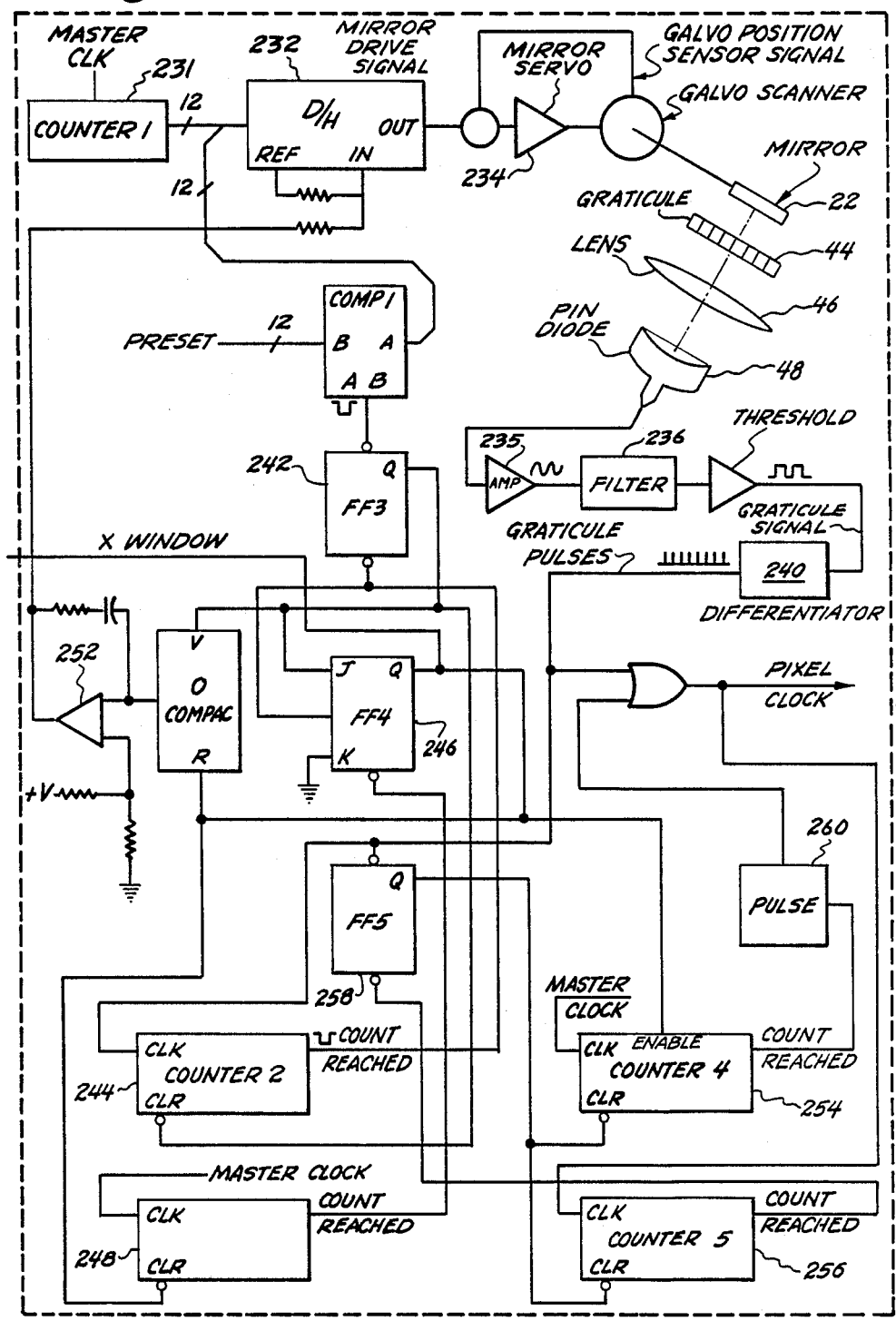

The mirror scan and table movement are synchronized so that the laser spot is accurately positioned. FIGS. 3A and 3B show a detailed block diagram of the control electronics used in one embodiment of an adaptive lithography system. The control is divided into three sections, which are: x-y table control, mirror scan control, and laser data control. The x-control portion is accomplished by the x position sensor in circuitry 114 being connected to an input port in the computer 32. Pulses are supplied from computer 32 to drive electronics 106 for x-direction stepping motor 104. The output of the x position sensor is compared in the computer 32 with the desired x position. Pulses are again supplied by the computer 32 to the stepper motor 104. The cycle is continued until the desired x position and the actual x position match within plus or minus one micron. The y position control has a mode identical to the x position control in which the computer 32 controls the position accuracy, but it also has a mode in which x-y table 30 is scanned at a fixed speed in synchronism with scanning mirror 22. The circuit is configured to operate in a self-standing mode, controlling acceleration, speed synchronization, and deceleration so that computer 32 is free to oversee the high speed data transfer of the image data for the patterns. Five words of data are supplied which represent specific y positions for x-y table 30, these are: base (a base position), edge 1 (the first edge of the substrate), edge 2 (the opposite edge of the substrate), slow (the position where deceleration should begin), and stop (the position where the x-y table 30 should stop). This data is written to random access memory (RAM) 210 by clearing address counter 212 and clocking address counter 212 from computer 32. For each new address, data is applied to the RAM 210 and then a write pulse is supplied. When the data has been written, address counter 212 is cleared to the first address and multiplexor 214 is switched such that the address counter clock is supplied from the output of comparator 216. Comparator 216 compares the present y position and the position stored in RAM 210 at the location addressed by address counter 212. The first address location would be the base y position. When the actual y position is the same as that stored in RAM 210, a pulse is issued from comparator 216. This pulse clocks address counter 212 to the next storage location in the RAM 210. Decoder circuit 218 is connected to the address and clocked by comparator 216. As a result, the base, edge 1, edge 2, slow, and stop locations are identified for use by appropriate control circuitry. Scanning is started when a pulse is issued from computer 32 to SR flip-flop 220. The output of flip-flop 220 is connected to integrator 222 whose output is connected to voltage controlled oscillator (VCO) 224. The output of VCO 224 is connected to y drive electronics 105 for controlling stepping motor 103. The result of the arrangement is that as integrator 222 integrates up, the voltage of VCO 224 is increased, and a stepping motor accelerates x-y table 30.

Figure 4:
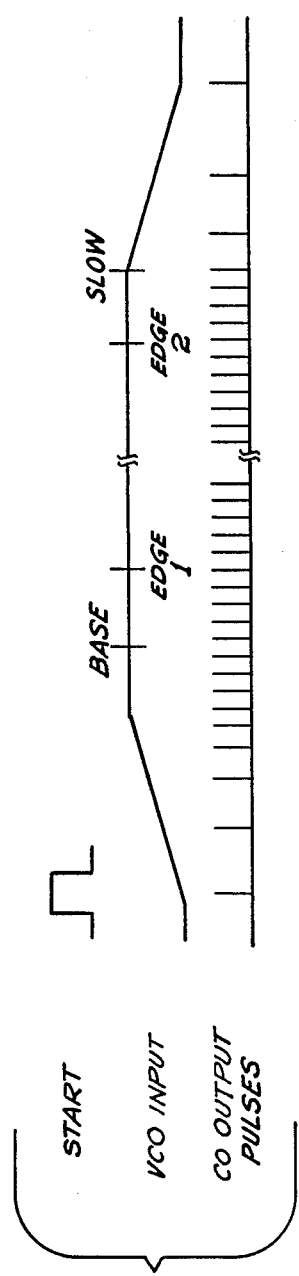
FIG. 4 is a graphical representation of start-run and stop-timing of the system.

The start-run and stop-timing of the system is shown in FIG. 4. It is understood that as integrator 222 continues to integrate, it eventually reaches a voltage greater than the voltage set by resistive divider 226 consisting of resistors $R_1$ and $R_2$. At this point diode D1 is cut off and the voltage to VCO 224 no longer rises. The speed of x-y table 30 then remains essentially fixed with x-y table 30 continuing to move at essentially constant speed until the slow position stored in RAM 210 is traversed. The slow pulse resets flip-flop 220, and integrator 222 integrates downward. VCO 224 decreases the speed of stepper motor 103 at a fixed ramp rate. When the stop position is traversed, a pulse is issued to flip-flop 228 which then completely disables VCO 224 and, therefore, no further pulses are sent to drive electronics 105. Additional circuitry provided in the x-y control allows synchronization of the x-y table position with the mirror scan. This circuitry is connected to provide a vernier adjustment of the approximately constant speed voltage provided to VCO 224 by resistor divider 226.

The mirror scan control (see FIG. 3B) provides a basic scan signal to mirror 22, and a vernier adjustment of that scan signal so that the time to traverse a particular angle exactly matches the desired scan rate. In addition, a circuit is provided for very accurately determining the position of the mirror during the active data portion of the scan and for supplying clock pulses to clock data to laser modulator 12 such that the data supplied corresponds exactly to the position of the laser spot on the substrate being exposed.

Figure 5:
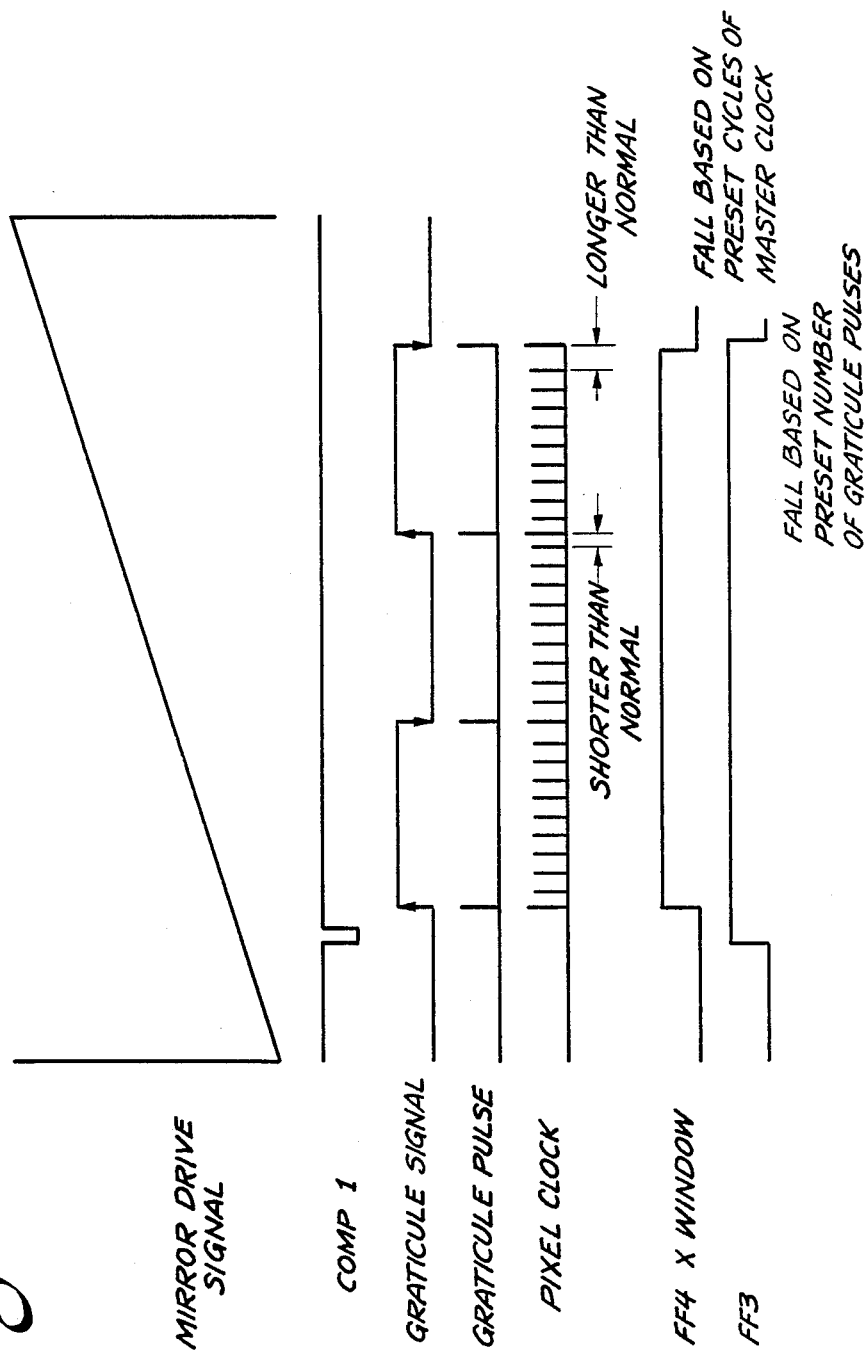
FIG. 5 is a graphical representation of mirror scan and pixel clock timing.

FIG. 5 shows a timing diagram for the important waveforms shown in the mirror scan control circuit. The basic position drive is derived from counter 230 which counts pulses from master clock 231 and outputs the count to a digital-to-analog converter 232. The output from digital-to-analog converter 232 is a sawtooth waveform and is the mirror drive signal. The period of the sawtooth is directly related to master clock 231 which is used for timing synchronization throughout the scan control system. In the embodiment illustrated, counter 230 overflows when the count reached is 2,048 and then counter 230 starts over again at zero. The mirror drive signal is applied to mirror servo circuit 234 which provides a drive to galvanometer mirror scanning device 20. Galvanometer device 20 is equipped with a position sensor which feeds back information to the mirror servo circuit 234 to allow the mirror to be quickly driven to positions directly corresponding to the mirror drive signal. Unfortunately, there is drift in the mirror position sensor and there is jitter in the position of the mirror 22 caused by bearing fluctuations. These effects cause the mirror position to be only approximate and not generally repeatable relative to the high level of accuracy required in the adaptive lithography system. For this reason, alignment laser 42 is directed at scanning mirror 22 and the reflected alignment beam is passed through graticule 44 and focused on PIN diode 48. The output signal from PIN diode 48 is amplified by amplifier 235, filtered by filter 236, and thresholded by threshold detector 238 to provide a square wave signal which is exactly representative of the angular position of scanning mirror 22. Graticule 44 consists of opaque lines and clear spaces. The edges of the square wave signal output correspond to the edges of graticule 44. Graticule 44 contains fewer lines by a factor of ten than the number of pixels which must be scanned by mirror 22 onto substrate 28 over the corresponding angle. Ideally, a one-for-one correspondence would be desired. Unfortunately, alignment laser 42 cannot be focused sufficiently well on graticule 44. Thus, a very low-level, unreliable signal otherwise would result which is highly dependent on dust particles and other contaminants landing on graticule 44. Pulse circuit differentiator 240 receives the output of threshold detector 238 to create a pulse on each edge; that is, from black to clear as well as from clear to black, for use by the rest of the circuitry. The graticule signal and corresponding graticule pulses are shown in FIG. 5. Flip-flop 242 enables counter 244 at the time when counter 230 reaches a preset count which is chosen so that counter 244 is enabled slightly in advance of the sweeping of the main laser beam over the area to be exposed. The J input to flip-flop 246 is also enabled so that when the first graticule pulse occurs, flip-flop 246 is set and counter 248 is enabled. Counter 248 subsequently counts a preset number of master clock pulses before its output resets flip-flop 246. During this same interval, counter 244 counts a preset number of graticule pulses before its output resets flip-flop 242. The outputs of flip-flop 242 and flip-flop 246 are compared in a phase comparator circuit 250. The output of phase comparator circuit 250 drives amplifier 252 that provides a vernier control voltage to digital-to-analog converter 232 providing the mirror drive signal. Therefore, the angle of mirror 22 is controlled so that a fixed number of graticule pulses occurs during a fixed number of master clock pulses. As a result, the speed of mirror 22, while it is scanning the area on substrate 28 to be exposed, is synchronized to master clock 231. A drift in the mirror position servo circuit 234 is automatically compensated by this vernier control circuitry.

Unfortunately, mirror jitter, which is essentially a noise quantity, can cause the mirror to deviate more than one pixel element away from its ideal location. To eliminate this effect, the circuitry of counters 254 and 256, in conjunction with the graticule pulses, generates a pixel clock signal which is precisely related to the actual position of mirror 22. Counter 254 is clocked by master clock 231 and is enabled by flip-flop 246. Counter 256 is cleared by flip-flop 258. Flip-flop 258 is set by graticule pulses and reset by the output of counter 256. After counter 254 reaches a present count, its output causes a pulse to be issued. Counter 254 pulses are combined with the graticule signal pulses to form the pixel clock. This circuit portion works as follows: whenever a graticule signal occurs, counter 254 begins counting the master clock pulses; each time counter 254 overflows, a pulse is issued to the pixel clock; counter 256 counts the pixel clock and when nine pixel clock pulses have occurred, flip-flop 258 is reset; counter 254 and counter 256 are both cleared and must wait until another signal occurs; when another graticule signal occurs, a new pixel clock signal is issued. In this way, nine pulses equally spaced, occur in response to each graticule signal. An additional pulse, which is the tenth pulse in the series, is coincident with the graticule signal and is provided by pulse block 260. Hence the pixel clock is locked to the graticule signal. The graticule signal indicates the exact position of the scanning mirror 22 while there are ten time as many pixel clocks as there are graticule signal transitions. The pixel clock is used to identify each pixel position which is scanned by the laser.

The laser data control circuitry shown in FIGS. 3A and 3B indicates that high speed processor 35 is incorporated in the computer system using an interface board 36. A section of memory is shared between computer 32 and interface board 36. Data is stored on a Winchester type disk in computer 32 in vector format such that each rectangle to be written is given an x minimum, a y minimum, an x maximum, and a y maximum. Vectors describe a line as two points. These two vectors then define any rectangle. A series of bits called a bit map is generated to turn the laser beam on and off as it scans substrate 28. High speed processor 35 calculates the bit map from the vector rectangle data. Only a small section of the total area to be scanned is covered by the bit map; in this embodiment of the invention a section which is 1,024 pixels wide by 256 pixels long is computed and stored. The 1,024 pixels correspond directly to the width of the active scan area scanned by scanning mirror 22, and the 256 pixel length corresponds to the y motion of the table which occurs during the 256 sequential scans of the mirror 22. High speed processor 35 processes the sorted vector data and places it in one section of pingpong memory and subsequently sets up direct memory access pointers such that data is supplied sequentially from the pingpong memory whenever it is requested by the control electronics. A pingpong memory is one that has data read out of one half of the memory, as data is loaded into the other half. In the meantime, high speed processor 35 calculates the next set of 1,024 by 256 points and places this set in the second half of the pingpong memory. When the first half of the pingpong memory is exhausted, the direct memory access points are set to the other half, and high speed processor 35 begins computing the next bit map in order. Data is transferred from high speed processor 35 in 16-bit words. The data transfer process begins when flip-flop 260 is set by the first edge signal. This occurs when the first edge of substrate 28 to be scanned is directly under the laser scanning beam. Flip-flop 262 synchronizes this event with the x window signal which indicates that scanning mirror 22 is at the start of its scan position. At this point, word counter 268 and the requisite flip-flop 264 are reset. Word counter 268 begins to count pixel clocks and when eight pixel clocks have occurred, word counter 268 clocks flip-flop 264 which makes a request for data to the direct memory access circuitry of high speed processor 35. Data is supplied from high speed processor 35 to latch circuit 266 with a data acknowledged signal. Data is latched to latch circuit 266 and flip-flop 264 is reset. When sixteen pixel clocks have occurred word counter 268 indicates a pulse which loads data from latch circuit 266 to shift register 270. The output of shift register 270 is supplied to laser modulator 12. By this method, data is continuously supplied to shift register 270 and clocked by the pixel clock to modulate laser 10 with the appropriate data for the exact position of the laser beam on substrate 28 to be exposed. When the far edge of the substrate is reached, the far edge signal resets flip-flop 26 and the next x window signal clocks flip-flop 262 which holds word counter 268 and flip-flop 264 in their inactive states.

Figure 6:
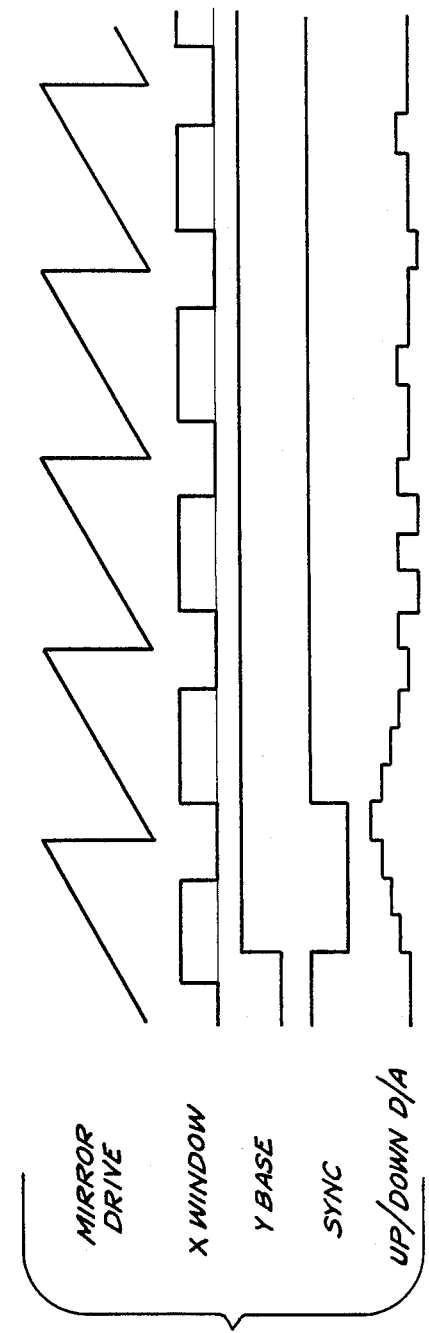
FIG. 6 is a graphical representation of timing of the x-y table synchronized to the mirror scan.

The circuitry to accomplish synchronism between x-y table 30 and scanning mirror 22 is shown in FIGS. 3A and 3B in the x-y table control section. While x-y table 30 is accelerating to its nominal speed, up/down counter 272 is held in its zero position by the output of flip-flop 274. When x-y table 30 reaches the y base position flip-flop 274 is set, up/down counter 272 is enabled, and up pulses are supplied to up/down counter 272 from counter 276 which is clocked by master clock 231. Counter 276 is reset by x window pulse such that output pulses from counter 276 are synchronized with the x window. The count for counter 276 is chosen so that six outputs occur for each x window pulse. This is because x-y table 30 travels six microns between sequential scans of scanning mirror 22. Down pulses are supplied to up/down counter 272 from y-position sensor 116 on x-y table 30. Counter 272 remains at the zero position if the number of up pulses equals the number of down pulses. If more of one pulse than the other occurs, up/down counter 272 accumulates the pulses so that the output of digital-to-analog converter 278, connected to up/down counter 272 provides a voltage correction to VCO 224 to either increase or decrease the number of pulses to stepping motor 105 and, thereby, to bring x-y table 30 motion back into synchronism with the mirror position. Flip-flop 280 enables the y-move pulses to be supplied to up/down counter 272. When the base signal occurs, flip-flop 280 is reset and y move pulses are not applied to the up/down counter 272. Flip-flop 280 is subsequently set by the x window transition indicating the beginning of the scan to scan mirror 22. Up pulses from counter 276 are accumulated in up/down counter 272 over the period from the occurrence of the y-base signal until the occurrence of the x-window signal. In this way, although there are six microns between each scan of the scanning mirror 22, the exact micron desired, as identified by y base, is forced to correspond to the starting of the mirror scan as identified by the rise of the x-window signal. FIG. 6 shows the timing thus described where it is shown that up/down counter 272 accumulates from the onset of the y base signal to the rise of the x-window signal. At this point, the servo circuitry forces coincidence between x-y table 30 position and the counts synchronized to the x-window signal such that up/down counter 272 averages to zero with only plus or minus one count discrepancy. This means that x-y table 30 is held at speed to within one micron of the exact desired position corresponding to scanning mirror 22.

The operation of the adaptive lithography system has been explained in terms of converting a file stored in rectangular vector form to a controlled flow of data which modulates a laser beam in synchronism with its exact position on substrate 28 to be exposed. If all components could be positioned to sufficient accuracy, the laser could scan a fixed pattern of interconnect wiring. However, commercially available chip placement devices are not sufficiently accurate to position chips within the resolution capability of a laser scan system. In accordance with this invention, a method is disclosed for modifying artwork representing an ideal interconnect pattern to accommodate the actual position of the integrated circuit chips. The four major steps required are: generating artwork for the ideal case, determining the actual positions of each integrated circuit component, modifying the artwork to match the actual chip positions, and using the modified artwork to drive the adaptive lithography scanning system.

Figure 7:
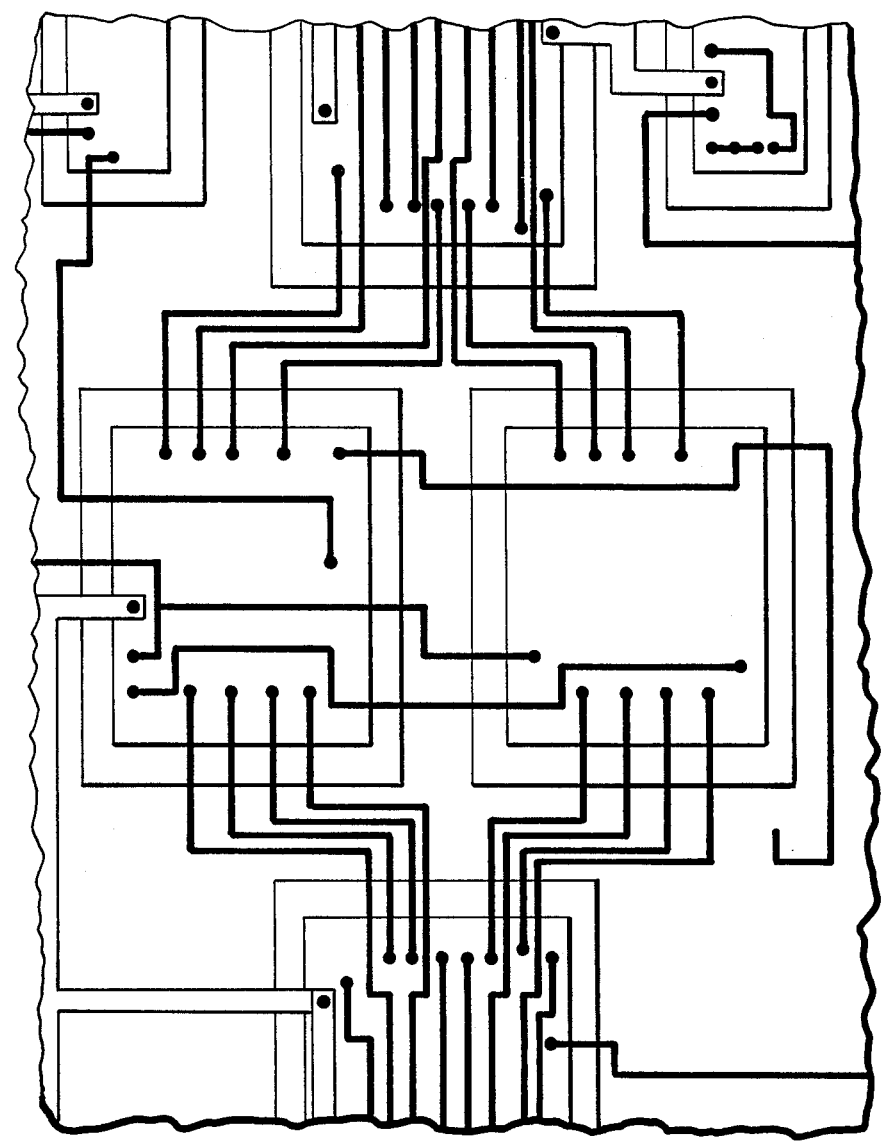
FIG. 7 is a plan view of ideal artwork.

Ideal case artwork can be generated using a computer aided layout system or an automatic routing system. The article entitled "End-to-End Design" by Richard Angell on pages 97 to 119 of the November 1986 issue of *PC Tech Journal* describes the PCB-3 design system from P-CAD for generating and converting electronic schematics through placement and routing of printed circuit boards. The article entitled "PC Board Layout Via AutoCAD TM " by Charles Jubb on pages 51 to 59 of the Volume 1, Number 2 issue of *Cadence* discusses overlay programs for the AutoCAD TM software package from Autodesk, Inc. An implemenation of this invention uses an AutoCAD TM printed circuit layout device which allows various layers to be defined according to user selected spacing and user selected line width. The AutoCAD TM system runs on various microcomputers with a mouse input device to define the extent and position of the interconnecting lines. The AutoCAD TM system outputs a document exchange file (DXF) which contains a hierarchical structured definition of the artwork according to each layer. Listing 1 in Appendix A shows a portion of a DXF file. In the hierarchy, a block which defines the outline of each integrated circuit chip can be defined. FIG. 7 shows a portion of a simple interconnect pattern between the outlines 300 of several integrated circuits. An interconnect layer and a via layer shows the via interconnections from the conductors to pads on the chips. A second outline 310 marks the limit of the extent to which the chip can be misplaced. The second outline 310 can be changed depending on the positioning equipment used. The DXF file is stripped of its hierarchy in a process referred to as levelling so that the various important pieces of information can be used by other programs in the adaptive lithography system. Levelling creates all interconnect, via hole definitions, and chip boundary definitions according to a known format. Any computer aided design (CAD) system can interface to the adaptive lithography system with only changes in the software which convert to the stripped level of data coding being necessary.

Via hole (i.e. the location of the via holes which are aligned with connection pads of the chip) and chip outline information are used to find the actual positions of each electronic component in the system. Ideally, this process is performed automatically with CID camera 26 using image recognition techniques to align each component and calculate offset and rotation information. The process as actually implemented, however, is at this time partially manual. The substrates are first aligned on the x-y table 30 in terms of position and rotation according to fiducial marks on substrates 28 by observing a television monitor 40 which displays an image from CID camera 26. Television monitor 40 is equipped with a bull's eye or cross hair pattern on the center of the screen. When the fiducial mark on substrate 28 which corresponds to the zero position of mirror 22, is under the cross hairs, the x and y position counters, indicated by control circuitry 114 and 116 in FIG. 2, are reset to zero. Computer 32 now supplies pulses to x and y stepping motors, 104 and 103, respectively, to step to the ideal position of the upper right hand pad of the first integrated circuit chip. A mouse input device connected to computer 32 is used to move one pad of the actual chip directly under the cross hairs. The difference between the actual position and the ideal position is recorded. Next, computer 32 steps x-y table 30 to the expected position of a pad on the opposite side of the chip, making the assumption that the chip is not rotated from the ideal position. The mouse is then used to position the pad directly under the cross hairs. At this point, it is possible to compute both offset and rotation of the chip. Computer 32 then steps x-y table 30 to the next chip in the sequence with the process being repeated until the position and rotational offsets of all chips have been recorded. The information gathered is stored in a data base which defines the chip positions. Listing 2 in Appendix B shows a program written in the C programming language for determining the location and rotation of each chip according to the method outlined. Copyright rights in this program and derivatives thereof in both form and language nonetheless are vested in the assignee.

Figure 8:
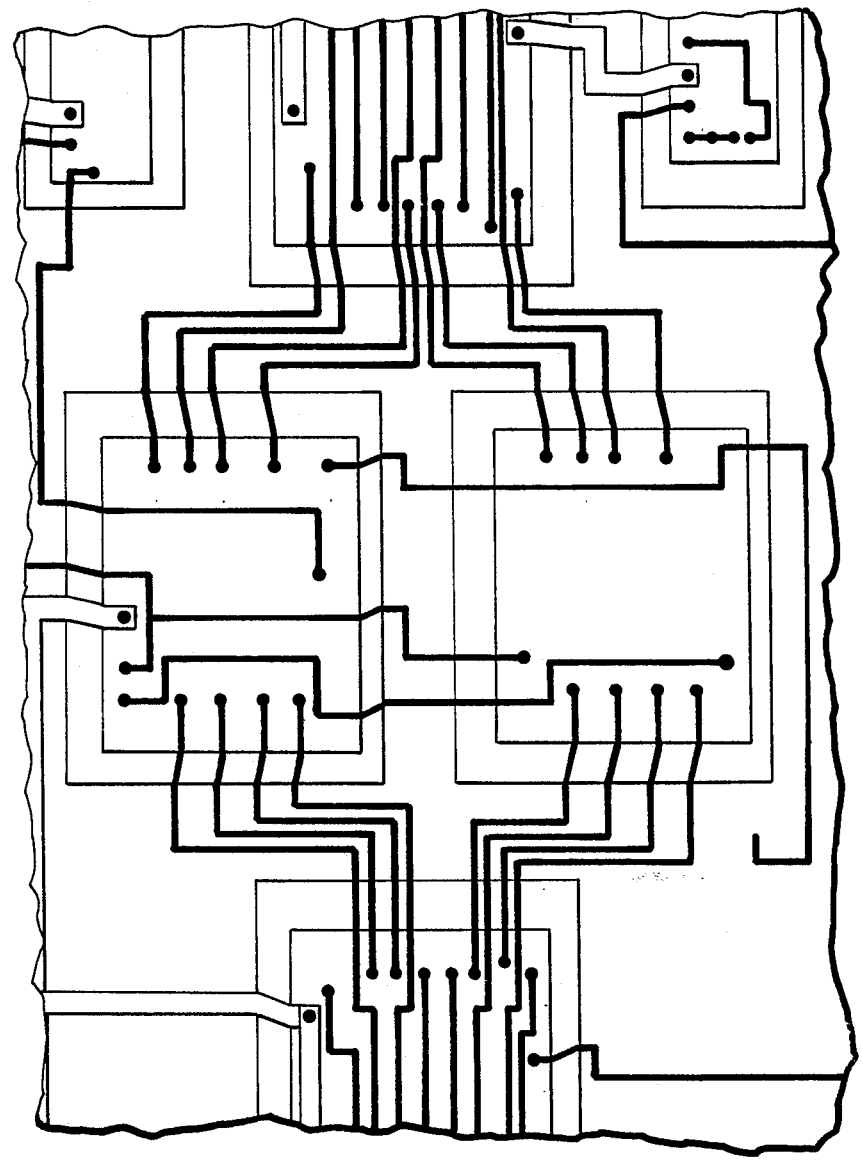
FIG. 8 is a plan view of modified artwork.

The ideal artwork generated in the first step and shown in FIG. 7 is then modified to match the actual chip position as shown in FIG. 8. Note that there are three distinct areas in this modified artwork. The first area is the interconnect pattern outside of second outline 310 which defines the degree to which the chip can be misplaced. In the first area the interconnect pattern is unchanged from the ideal case. The second area is the area that overlies integrated circuit chip outline 300 which defines the boundaries of the integrated circuit chip in question. All of the interconnect pattern and associated via holes are modified to incorporate the offset and rotation associated with the given integrated circuit chip. The third area is the area between the integrated circuit chip outline 300 and the second outline 310 defining the limit of misplacement of the chip. In this area interconnects which cross the boundary start from an unchanged position and end at the positions which are changed in offset and rotation according to the actual position of the chip. Listing 3 in Appendix C is a computer program written in the C computer programming language for the purpose of modifying the artwork as described. Copyright rights in this program and derivatives thereof in both form and language nonetheless are vested in the assignee.

The modified artwork is then used to supply the routines which position x-y table 30 and supply data to high speed processor 35 for the purpose of driving the adaptive lithography scanning system and modulating the laser beam to "paint" the appropriate modified pattern on the substrate to be exposed. Listing 4 in Appendix D is the TMS 320 high speed processor 35 assembly language program for accomplishing this task. Copyright rights in this program and derivatives thereof in both form and language nonetheless are vested in the assignee.

Figure 9:
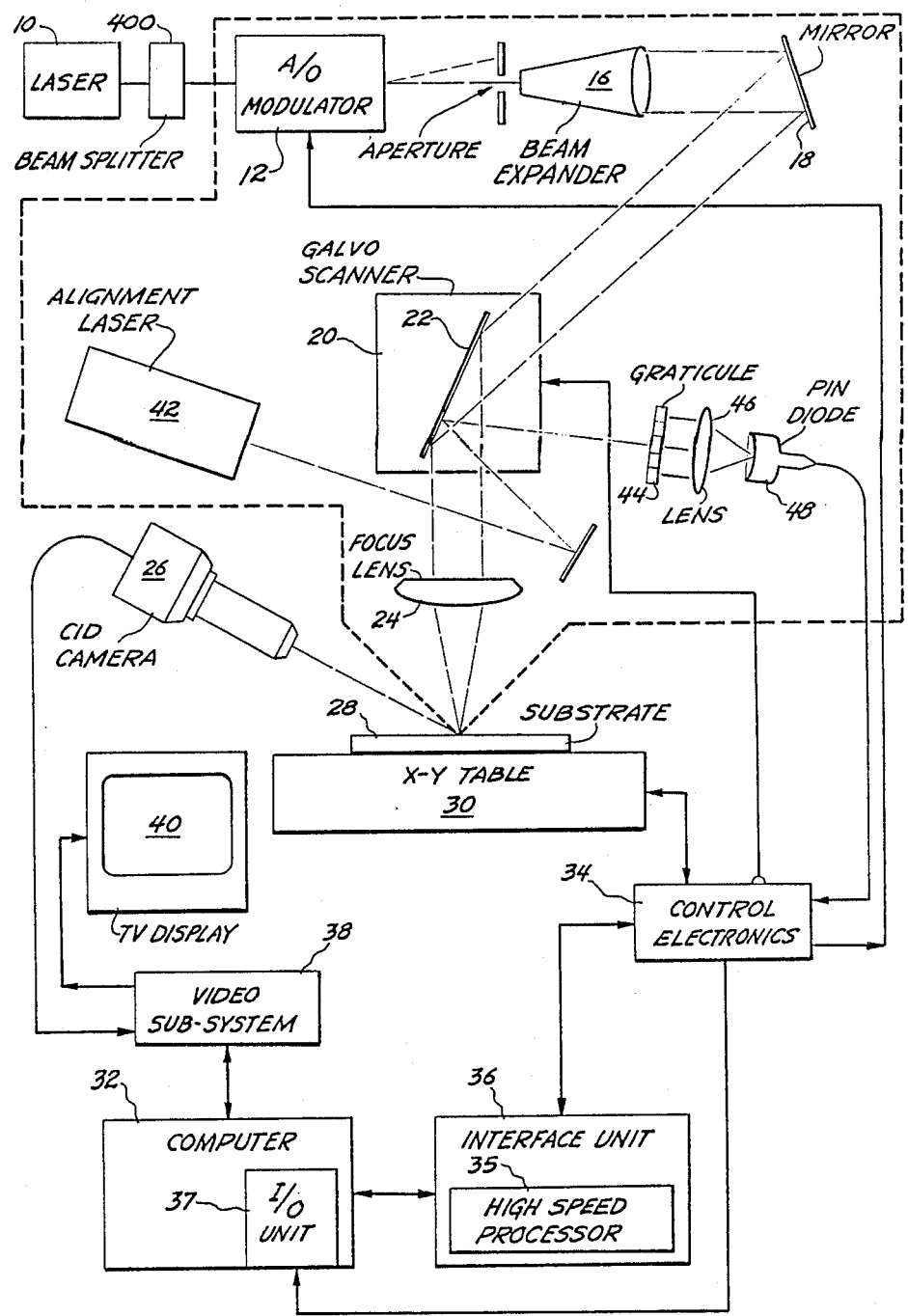
FIG. 9 is a block diagram of adaptive lithography system showing the portions to be duplicated for multiple substrates.

To obtain the desired throughput rate, the system can be duplicated as many times as required. FIG. 9 shows the parts of the system which should be duplicated separated from the parts of the system which can be shared. The duplicatable parts are enclosed in a dotted block. Beam splitter 400 is positioned in front of the laser 10 to divide the single beam laser into as many beams as are required. Typically an input power of 0.2 watts is sufficient to expose photoresist. This is easily accomplished by dividing a 2 watt laser into ten beams. A substantial cost savings results from sharing x-y table 30, computer 32, CID camera 26, television display 40, video subsystem 38, alignment laser 42, and graticule 44, as well as dust elimination equipment and housing facilities. Acousto-optic modulator 12, beam expander 16, galvanometer scanner 20, and focus lens 24 must be duplicated for each laser beam. However, x-y table 30 and CID camera 26 need not be duplicated because all substrates 28 to be scanned can be mounted on a single table and only one CID camera is necessary to determine the position of each substrate 28. High speed processor 35 with latches and chip registers which drive the acousto-optic modulator 12 are also required for each substrate 28 so that the artwork for the substrate 28 can be converted from rectangle vector form to bit map form in real time.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

APPENDIX A

Listing 1

```
SET -10
     2
       HEADER
       9
$PCRDVER
AC1.50
       9
  TEXTMIN
    10
    0.0
    20
    0.0
     9
  TEXTMAX
    10
 50.8
    20
 52.324
     9
$LIMMIN  LIMMIN
    10
    0.0
    20
    0.0
     9
$LIMMAX
    10
 50.8
    20
 50.8
     9
  VIEWCTR
```

```
   MT1
    10
    0.5
    20
   19.375
    11
    0.5
    21
   18.125
    12
    1.75
    22
   19.375
 13
    1.75
 23
   19.125
    0
   TRACE
    6
   MT1
```

```
        10
 45.45.32445141
        20
       25.5
        0
     fVIEWSIZE
        40
 51.0  51.0
        0
      INSERT
        6
       MT1
        2
     ICLS147 3
        10
       5.0
        20
      9.199
        0
      INSERT
        8
       MT1
        2
      ICLS167
        10
 30    3.0
        20
      12.199
        0
 TRCT  TRCE
        8
```

```
        10
        0.5
        20
 16.875  16.875
        11
        0.5
        21
 15.625  15.625
        12
       1.75
        22
      16.875
        13
       1.75
        23
 15.625  15.625
        0
      POINT
        6
       DRL
        10
      3.085
        20
      1.317
        0
 ENDBLK ENDBLK
        0
 ENDSEC ENDSEC
        0
       EOF
```

APPENDIX B

Listing 2

Copyright rights in this program and derivatives in both form and language nonetheless are vested in the assignee.

Listing of c file laser.c at Wed Dec 10 14:36:25 1986

```
/*****************************************************************************
*       Title    laser.c
*       Author   K2 Welles
*       Date     12/19/85
*       c.date   Wed Dec 10 14:36:26 1986
*       Lang     Microsoft C     (IBM PC)
*       (c)      Copyright 1985 General Electric
*       Batch    1a              (IBM PC edit, compile, link)
*       Compile  MSC laser,;     (IBM PC)
*                LINK laser+graphibm+motor+skydt+peek,;
*       Hrdware  NOTE: special hardware is required to run this system.
*                see LASERDEF.H for port definitions
*****************************************************************************/

/*************   BUGS AND ERRORS TO FIX   *************************************
* Report         Problem                                                   Fix
*  3/10 make sure non-pad vias in the ics are rotated properly
*  3/21 if dt2803 not operational, system hangs on no -f
*  3/21 make text randomly grabbed every time it is used
*  4/ 8 help on -help or help
*  4/ 9 on align chip, use all the new info to help position the system
*  5/30 allow mode 4 to skip fiducial alignment
*  0/22 last hole drilled appears to be drilled multiple times
*
*****************************************************************************/

/***************    OPTIONS FOR LASER   ***************************************
  This program is normally run by typing:
>laser hdic <cr>
   which runs laser on the hdic files made from hdic.dxf by agv, bgv and cgv
  Options can be added (any number in any order) in the following fashion:
>laser hdic -f <cr>
   Initialize the DT2803.  This must be done after power up.
>laser -z300 hdic <cr>
   This makes all holes drilled by the laser 300 microseconds long
>laser hdic -hprofile.2 <cr>
   This causes the file named "profile.2" to be used to drill all holes
>laser -m32 hdic <cr>
   This makes all stepper motor moves slower by a 32 step for loop
>laser hdic -r-3 <cr>
   This adds -3 microns to the vertical offset between alternate scans
        (default is +2 microns)
>laser -d1024 hdic <cr>
   Set the variable debug to 1024 (see below).  This value causes fiducials
     to be written without the substrate numbers
>laser -z20 -f hdic -d160 <cr>
   Drill holes 20 microseconds, initialize the DT2803, stop table at every
     pin (debug & 32), and type the routine names as they are entered
     (debug & 128).  this is a valid command line
```

```
/****************************************************************************/
/****************************************************************************
*       DEBUG   VALUES
*****************************************************************************
*   BIT    FUNCTION
*     1    Type file names of all files opened or closed
*     2    Slow but accurate (i hope) x-y positioning
*     4    Type out all move_posit counts (for servo tuning)
*     8    Skip the DT2803 initialization
*    16    Move table to all pin positions after each chip alignment
*    32    Stop table at every pin during drilling, await <cr>
*    32    Debug get_rects and get_under
*    64    Debug get_rects
*   128    Type the routine names as entered
*   256    Do not write fiducials
*   512    Force 1023 * divx micron delta x
*  1024    Disable the fiducial numbering system
*  2048    Debug chip alignment
*  4096    Eliminate the text
*  8192    Debug the sky_sync pause
* 16384    Defeat the extra y-margin on scanning
*****************************************************************************/

/****************************************************************************
*       DIAGNOSTIC MESSAGES
*****************************************************************************
*     1    Type out hole co-ordinates as they are drilled
*
*
*****************************************************************************/ include "stdio.h"
include "math.h"
#include "time.h"
#include "localcpu.h"
#include "laserdef.h"

/****************************************************************************
*       CONDITIONALS
*****************************************************************************/

/****************************************************************************
*       DEFINITIONS
*****************************************************************************/
#define MAXPINS    900  /* maximum pins per chip to drill */
#define MAXCHIP     20  /* maximum chips per substrate to align */
#define MAX_HOLE    40  /* maximum hole profile counts */

/****************************************************************************
*       NON-INTEGER FUNCTIONS
*****************************************************************************/
    long read_x (), read_y ();
    double sqrt ();
    char *ccat (), *str_time ();

/****************************************************************************
*       GLOBAL VARIABLES
*****************************************************************************/
    int layer, substnum, fusec, usec, rstr_offset, diag_msg;
    int divx, divy;
    extern int step_speed;
    long debug, stp_test;
    char basename [40], mtname [40], drname [40];
    char subsname [40], trname [40], temp  [40];
    char *trext [] = {".tr1", ".tr2", ".tr3"};
    char *mtext [] = {".sc1", ".sc2", ".sc3"};
    char *drext [] = {".vi1", ".vi2", ".vi3"};
    char nmext [5] = ".000";
    char profile_name [20] = "profil.hol\0\0\0\0\0\0\0\0\0\0";
    char strg [80], ascii_dot [96] [7], text_txt [5] [80];
    float ax, b, c;
    FILE *ftr, *fmt, *fdr, *fsubstrate;

/*** Global values of microscope to scan and drill positions ****************/
    int maxbreak, x_error [128];
    int max_hole;
    struct { int repeat, x, y, on, off; } hole [MAX_HOLE];
    long xscan_offset, yscan_offset, xdrill_offset, ydrill_offset;
    long x_break_pnt [128];

/*** Global values for chip orientation *************************************/
    int    maxpins, maxchip;
    long   x_file   [MAXPINS], y_file   [MAXPINS];
    int    ref_pin  [MAXCHIP];
    long   x_offset [MAXCHIP], y_offset [MAXCHIP];
    long   x_cntrd  [MAXCHIP], y_cntrd  [MAXCHIP];
    float  ic_rot   [MAXCHIP];

/*** Global values for chip scanning ****************************************/
    int    trap [10000];
    int    ara  [10000];
    int    zro  [10] = {0, 0, 0, 0, 0, 0, 0, 0, 0, 0};
    long   startx, endx, starty, endy, deltax;
```

```c
main (argc, argv)
    int argc;
    char *argv[];
{
    int choice;
    long x1, y1;

get_params (argc, argv);
    init_hdw ();
    init_sys ();
    choice = get_mode ();
    switch (choice) {
        case 1: /** Lay down the LEG layer only **/
            align_scan ();
            for (;;) {
                align_rotation ();
                concat (basename, ".fud", mtname);
                concat (basename, ".nul", trname);
                scan_metal ();
                printf ("Do you wish to scan another substrate? ");
                scanf ("%s", strg);
                if ((strg [0] != 'y') && (strg [0] != 'Y')) break;
            }
            break;
        case 2: /** Align to pads, drill vias (level 1) and fiducials **/
            align_drill ();
            for (;;) {
                get_substnum (0);
                align_rotation ();
                concat (basename, drext [layer - 1], drname);
                align_chips ();
                if ((stp_test & 1) == 0) drill_vias ();
                if (layer == 1) drill_fiducials ();
                display_vias ();
                if (layer == 1) display_fiducials ();
                x1 = y1 = 0;
                move_posit (x1, y1);
                printf ("Do you wish to drill another substrate? ");
                scanf ("%s", strg);
                if ((strg [0] != 'y') && (strg [0] != 'Y')) break;
                substnum = 0;
            }
            break;
        case 3: /** Align to fiducials and re-drill the vias **/
            align_drill ();
            for (;;) {
                get_substnum (1);
                align_substrate ();
                concat (basename, drext [layer - 1], drname);
                if ((stp_test & 1) == 0) drill_vias ();
                display_vias ();
                x1 = y1 = 0;
                move_posit (x1, y1);
                printf ("Do you wish to re-drill another substrate? ");
                scanf ("%s", strg);
                if ((strg [0] != 'y') && (strg [0] != 'Y')) break;
                substnum = 0;
            }
            break;
        case 4: /** Scan a metal layer **/
            align_scan ();
            for (;;) {
                get_substnum (1);
                align_substrate ();
                concat (basename, mtext [layer - 1], mtname);
                concat (basename, &nmext [1], temp);
                concat (temp, trext [layer - 1], trname);
                scan_metal ();
                printf ("Do you wish to scan another substrate? ");
                scanf ("%s", strg);
                if ((strg [0] != 'y') && (strg [0] != 'Y')) break;
                substnum = 0;
            }
            break;
        default: printf ("error in c.line 222\n"); break;
    }
    close_graphics ();
}

/***************************************************************************
*       Get the mode of the operation requested
***************************************************************************/
get_mode ()
{
    int choice;

for (;;) {
        printf ("1) Scan the IC placement boundaries onto substrates\n");
        printf ("2) Align the ICs and drill the via holes\n");
        printf ("3) Align to fiducials and redrill the via holes\n");
        printf ("4) Scan the metal layers for this substrate\n");
        switch (random (5)) {
            case 0: printf ("    What is your pleasure master? "); break;
            case 1: printf ("    Whaddaya want dummy? "); break;
            case 2: printf ("    Please make up your mind? "); break;
            case 3: printf ("    Awaiting your slightest whim? "); break;
            case 4: printf ("    Hurry up and choose idiot? "); break;
```

```
        }
        scanf ("%d", &choice);
        if ((0 < choice) && (choice < 5)) break;
        switch (random (3)) {
            case 0: printf ("Wrong choice, please try again.\n\n\n"); break;
            case 1: printf ("FOOL, ONLY 1-4 IS ALLOWED\n\n\n"); break;
            case 2: printf ("Perhaps I will have to kill you\n\n\n"); break;
        }
    }
    if (choice > 1) {
        for (;;) {
            printf ("What layer would you like to expose? ");
            scanf ("%d", &layer);
            if ((0 < layer) && (layer < 4)) break;
            printf ("Only 1, 2 and 3 are valid choices zuchinni brain\n\n\n");
        }
    }
    return (choice);
}

/*****************************************************************************
*       Align the microscope to the drill position
*****************************************************************************/
align_drill ()
{
    int  j, x, y;
    long x_temp, y_temp;

if (xdrill_offset) {
        printf ("The drill offset is x=%ld, y=%ld\n", xdrill_offset,
            ydrill_offset);
        printf ("Do you wish to update the drill alignment manually? ");
        scanf ("%s", strg);
    }
    else {
        printf ("File table.aln does not exist\n");
        printf ("Table must be aligned manually\n");
    }
    while ((strg [0] == 'y') || (strg [0] == 'Y') || (strg [0] == 0)) {
        printf ("Mouse move point to drill under cursor\n");
        move_til_button ();
        x_temp = read_x ();
        y_temp = read_y ();
        printf ("Set up the UV laser to drill\n");
        move_posit (x_temp + xdrill_offset, y_temp + ydrill_offset);
        printf ("Enter any number to drill? ");
        scanf ("%d", &j);
        micro_zap (usec, 1);
        printf ("Put drilled spot under the cursor with the mouse\n");
        move_posit (x_temp, y_temp);
        j = mouse (&x, &y);         /* clear old mouse movement */
        move_til_button ();
        xdrill_offset -= read_x () - x_temp;
        ydrill_offset -= read_y () - y_temp;
        printf ("New drill offset values are %ld %ld\n", xdrill_offset,
            ydrill_offset);
        save_table ();
        printf ("Do you wish to repeat the alignment procedure? ");
        scanf ("%s", strg);
    }
    return (1);
}

/*****************************************************************************
*       Align the microscope to the scan
*****************************************************************************/
align_scan ()
{
    int  j, x, y;
    long x_temp, y_temp;

if (xscan_offset) {
        printf ("The current scan offset is x=%ld, y=%ld\n", xscan_offset,
            yscan_offset);
        printf ("Do you wish to update the scan alignment manually? ");
        scanf ("%s", strg);
    }
    else {
        printf ("File table.aln does not exist\n");
        printf ("Table must be aligned manually\n");
    }
    while ((strg [0] == 'y') || (strg [0] == 'Y') || (strg [0] == 0)) {
        printf ("Mouse move left end of scan under cursor\n");
        move_til_button ();
        x_temp = read_x ();
        y_temp = read_y ();
        printf ("Set up the UV laser to scan\n");
        move_posit (x_temp + xscan_offset, y_temp + yscan_offset);
        printf ("Enter any number after scan is done? ");
        scanf ("%d", &j);
        printf ("Put left scan end under the cursor with the mouse\n");
        move_posit (x_temp, y_temp);
        j = mouse (&x, &y);         /* clear old mouse movement */
```

```
            move_til_button ();
            xscan_offset -= read_x () - x_temp;
            yscan_offset -= read_y () - y_temp;
            printf ("New scan offset values are %ld %ld\n", xscan_offset,
                yscan_offset);
            save_table ();
            printf ("Do you wish to repeat the scan alignment procedure? ");
            scanf ("%s", strg);
        }
        return (1);
}

/***************************************************************************
*       Save the new alignment data on the disk
***************************************************************************/
save_table ()
{
        int j;
        FILE *ftable;

ftable = fopen ("table.aln", "w");
        if (ftable > 0) {
            fprintf (ftable, "%ld %ld\n", xscan_offset,  yscan_offset );
            fprintf (ftable, "%ld %ld\n", xdrill_offset, ydrill_offset);
            fprintf (ftable, "%d\n", maxbreak);
            for (j = 0; j < maxbreak; j++) fprintf (ftable, "%ld %d\n",
                x_break_pnt [j], x_error [j]);
            fclose (ftable);
        }
        else {
            printf ("Unable to open table.aln for output, c.line 368\n");
            return (0);
        }
        return (1);
}

/***************************************************************************
*       Align the rotation of the substrate and set it to the corner
***************************************************************************/
align_rotation ()
{
        int  i, j, x, y;
        long xl, yl, yacc;

printf ("Move to the lower end of the left vertical edge ");
        printf ("and press the left button\n");
        move_til_button ();
        while (mouse (&x, &y) & 1);
        printf ("Rotate the table manually until the edge is vertical\n");
        printf ("Move left and right with mouse, when done, hit left button\n");
        for (;;) {
            yacc = 0;
            for (i = 0; i < 300; i++) {
                xl = 0; yl = 100;
                move_steps (xl, yl);
                yacc += yl;
                j = mouse (&x, &y);
                if (j & 1) break;
                xl = -x; if (j & 2) xl *= 10;
                yl = 0;
                move_steps (xl, yl);
            }
            if (j & 1) break;
            for (i = 0; i < 15000; i++) j = i + i;
            for (i = 0; i < 300; i++) {
                xl = 0; yl = -100;
                move_steps (xl, yl);
                yacc += yl;
                j = mouse (&x, &y);
                if (j & 1) break;
                xl = -x; if (j & 2) xl *= 10;
                yl = 0;
                move_steps (xl, yl);
            }
            if (j & 1) break;
            for (i = 0; i < 15000; i++) j = i + i;
        }
        for (i = 0; i < 15000; i++) j = i + i;
        xl = 0;
        yacc = -yacc;
        move_steps (xl, yacc);

printf ("Now line up the lower left corner to the cursor\n");
        printf ("and press the left button\n");
        move_til_button ();
        zero_table ();
}

/***************************************************************************
*       Align the substrate to the fiducial marks
***************************************************************************/
align_substrate ()
{
        int k;
        long x1, y1, x2, y2, x, y, xp, yp;
        float max_dist, x_dist, y_dist, dr, theta, dtheta;
```

```
    if (debug & 128) printf ("Entering routine align_substrate\n");
    printf ("Align to fiducials (1), lower left corner (2), no change (3)? ");
    scanf ("%d", &k);
    switch (k) {
      case 1:
        fdr = fopen ("fiducial.via", "r");
        if (fdr <= 0) {
            printf ("Unable to open fiducial.via at c.line 441\n");
            return (0);
        }
        fscanf (fdr, "%d", &k);
        fscanf (fdr, "%ld %ld", &x1, &y1);
        fscanf (fdr, "%ld %ld", &x2, &y2);
        x = y = 0;
        move_posit (x1, y1);
        printf ("Move fiducial under cross hairs, then press left button\n");
        move_til_button ();
        xp = read_x () - x1;
        yp = read_y () - y1;
        move_posit (xp, yp);
        zero_table ();
        move_posit (x2, y2);
        printf ("Now align this fiducial and press the left button\n");
        move_til_button ();
        x_dist = x2 - x1;
        y_dist = y2 - y1;
        max_dist = sqrt (x_dist * x_dist + y_dist * y_dist);
        if (y_dist != 0.0) theta = x_dist / y_dist;
        else               theta = 0;
        x_dist = read_x () - x1;
        y_dist = read_y () - y1;
        dr = sqrt (x_dist * x_dist + y_dist * y_dist) / max_dist;
        if (x_dist != 0.0) dtheta = theta * y_dist / x_dist;
        else               dtheta = 0;
        printf ("Ratio = %f, Angle = %f\n", dr, dtheta);
        printf ("Continue til both fiducials line up, press right & left\n");
        for (;;) {
            xp = x1 + x;
            yp = y1 + y;
            move_posit (xp, yp);
            if (move_til_button () == 3) break;
            x = read_x () - x1;
            y = read_y () - y1;
            xp = x2 + x;
            yp = y2 + y;
            move_posit (xp, yp);
            if (move_til_button () == 3) break;
            x = read_x () - x2;
            y = read_y () - y2;
        }
        move_posit (x, y);
        zero_table ();
        break;
      case 2:
        printf ("Move substrate until lower left corner is centered\n");
        move_til_button ();
        zero_table ();
        break;
      case 3:
        break;
    }
}

/****************************************************************************
*       Align the chips on this substrate
****************************************************************************/
align_chips ()
{
    int ic;
    long x, y;

if (debug & 128) printf ("Entering routine align_chips\n");
    if (substnum == 0) return (0);
    if ((fsubstrate = fopen (subsname, "w")) <= 0) {
        printf ("Unable to open %s for output c.line 508\n", subsname);
        return (0);
    }
    if (debug & 1) printf ("Opened file %s for output\n", subsname);
    if ((fdr = fopen (drname, "r")) <= 0) {
        printf ("Unable to open %s for input c.line 513\n", drname);
        return (0);
    }
    if (debug & 1) printf ("Opened file %s for input\n", drname);
    show_chips ();
    for (ic = 0; ic < MAXCHIP; ic++) {
        if (get_ic_holes (ic) == 0) break;
        align_ic (ic);
    }
    maxchip = ic;
    x = y = 0;
    for (ic = 0; ic < maxchip; ic++) {
        x += x_offset [ic];
        y += y_offset [ic];
    }
    x /= maxchip;
```

```
        y /= maxchip;
        for (ic = 0; ic < maxchip; ic++) {
            x_offset [ic] -= x;
            y_offset [ic] -= y;
        }
        move_posit (x, y);
        zero_table ();
        for (ic = 0; ic < maxchip; ic++) {
            fprintf (fsubstrate, "%d %ld %ld %f\n", ic, x_offset [ic],
                y_offset [ic], ic_rot [ic]);
        }
        fprintf (fsubstrate, "-1 -1 -1 -1.0\n");
        printf ("Generated a file called %s with these alignments\n", subsname);
        printf ("Average offset was x= %ld, y= %ld\n", x, y);
        fclose (fsubstrate);
        clear_graphics (0);
        fclose (fdr);
        return (1);
}

/******************************************************************************
 *      Scan the metal from files named in mtname and trname
 ******************************************************************************/
scan_metal ()
{
    int ichunks;
    long xr, yr;

if (debug & 128) printf ("Entering routine scan_metal\n");
    if ((fmt = fopen (mtname, "r+b")) <= 0) {
        printf ("Unable to open file %s for input\n", mtname);
    }
    if (debug & 1) printf ("Opened file %s for input\n", mtname);
    if ((ftr = fopen (trname, "r+b")) <= 0) {
        printf ("Unable to open file %s for input\n", trname);
        printf ("Enter any number to scan with no trapezoids\n");
        scanf ("%s", strg);
    }
    else {
        if (debug & 1) printf ("Opened file %s for input\n", trname);
        printf ("Metal scanning from files %s, %s\n", mtname, trname);
    }
    get_rects ();
    startx = endx = ara [1];
    starty = endy = ara [2];
    deltax = 0;
    ichunks = 1;
    while (get_rects ()) {
        if ((ara [1] - startx) && (deltax == 0)) deltax = ara [1] - startx;
        if (startx > ara [1]) startx = ara [1];
        if (endx   < ara [1]) endx   = ara [1];
        if (starty > ara [2]) starty = ara [2];
        if (endy   < ara [2]) endy   = ara [2];
        ichunks++;
    }
    if (debug & 512) deltax = 1023;
    startx *= divx;
    endx   *= divx;
    deltax *= divx;
    starty *= divy;
    endy   *= divy;
    rewind (fmt);
    endx += deltax;
    endy  += 768 * divy;
    starty -= 768 * divy;
    if (debug & 16384) {
        endy   -= 512 * divy;
        starty += 512 * divy;
    }
    printf ("X from %ld to %ld, steps of %ld\n", startx, endx, deltax);
    printf ("Y from %ld to %ld, in %d chunks\n", starty, endy, ichunks);
    printf ("Type any number to continue? ");
    scanf ("%s", strg);
    scan_bous (startx, endx, starty, endy, deltax);
    xr = yr = 0;
    move_posit (xr, yr);
    if (ftr > 0) fclose (ftr);
    fclose (fmt);
}

/******************************************************************************
 *      Drill the vias in file named drname
 ******************************************************************************/
drill_vias ()
{
    int ic, pins, i, j;
    long x, y, px, py;

if (debug & 128) printf ("Entering routine drill_vias\n");
    if ((fdr = fopen (drname, "r")) <= 0) {
        printf ("Unable to open file %s for input\n", drname);
        return (0);
    }
    if (debug & 1) printf ("Opened file %s for input\n", drname);
    show_chips ();
    for (ic = 0;; ic++) {
```

```c
        if (get_ic_holes (ic) == 0) break;
        for (pins = 0; pins < maxpins; pins++) {
            pin_cursor (pins);
            get_best_guess (ic, pins, &x, &y);
            for (i = 0; i < max_hole; i++) {
                px = (long) hole[i].x + x;
                py = (long) hole[i].y + y;
                move_posit (px + xdrill_offset, py + ydrill_offset);
                move_posit (px + xdrill_offset, py + ydrill_offset);
                for (j = 0; j < hole[i].repeat; j++) {
                    micro_zap (hole[i].on, 0);
                    micro_pause (hole[i].off);
                }
            }
            pin_cursor (pins);
            if (debug & 32) {
                text_position (1, 1);
                scanf ("%s", strg);
            }
        }
    }
    fclose (fdr);
}

/*****************************************************************************
*       Display the vias in file named drname
*****************************************************************************/
display_vias ()
{
    int ic, pins;
    long x, y;

if (debug & 128) printf ("Entering routine display_vias\n");
    printf ("Do you wish to display the vias just burned? ");
    scanf ("%s", strg);
    if ((strg [0] != 'y') && (strg [0] != 'Y')) return (-1);
    if ((fdr = fopen (drname, "r")) <= 0) {
        printf ("Unable to open file %s for input\n", drname);
        return (0);
    }
    if (debug & 1) printf ("Opened file %s for input\n", drname);
    show_chips ();
    for (ic = 0;; ic++) {
        if (get_ic_holes (ic) == 0) break;
        for (pins = 0; pins < maxpins; pins++) {
            pin_cursor (pins);
            get_best_guess (ic, pins, &x, &y);
            move_posit (x, y);
            move_posit (x, y);
            delay (10000);
            pin_cursor (pins);
            if (debug & 32) {
                text_position (1, 1);
                scanf ("%s", strg);
            }
        }
    }
    fclose (fdr);
}

/*****************************************************************************
*       Drill the vias from file fiducial.via to make the fiducials
*****************************************************************************/
drill_fiducials ()
{
    int holes, marks, i, j, k, l, chr;
    long xoff [30], yoff [30], xref [4], yref [4], xaoff, yaoff;

if (debug & 128) printf ("Entering routine drill_fiducials\n");
    if (debug & 256) return;
    if ((fdr = fopen ("fiducial.via", "r")) <= 0) {
        printf ("Unable to open file fiducial.via for input\n");
        return (0);
    }
    if (debug & 1) printf ("Opened file fiducial.via for input\n");
    fscanf (fdr, "%d", &marks);
    for (i = 0; i < marks; i++) fscanf (fdr, "%ld %ld", &xref [i], &yref [i]);
    fscanf (fdr, "%d", &holes);
    for (i = 0; i < holes; i++) fscanf (fdr, "%ld %ld", &xoff [i], &yoff [i]);
    fclose (fdr);
    for (i = 0; i < marks; i++) {
        for (j = 0; j < holes; j++) {
            move_posit (xref [i] + xoff [j] + xdrill_offset,
                        yref [i] + yoff [j] + ydrill_offset);
            move_posit (xref [i] + xoff [j] + xdrill_offset,
                        yref [i] + yoff [j] + ydrill_offset);
            micro_zap (fusec, 1);
            if (debug & 32) {
                text_position (1, 1);
                scanf ("%s", strg);
            }
        }
        if (((debug & 1024) == 0) && (substnum) && (i == 0)) {
            for (j = 1; j < 4; j++) {
                chr = nmext [j] - ' ';
                for (k = 0; k < 7; k++) {
```

```
                    yaoff = 400 - 40 * k;
                    for (l = 0; l < 5; l++) {
                        xaoff = j * 400 + 40 * l;
                        if ((ascii_dot [chr] [k] >> l) & 1) {
                            move_posit (xref [i] + xaoff + xdrill_offset,
                                        yref [i] + yaoff + ydrill_offset);
                            micro_zap (fusec, 1);
                        }
                    }
                }
            }
        }
    }
}

/***********************************************************************
 *      Display the fiducial holes just drilled
 ***********************************************************************/
display_fiducials ()
{
    int holes, marks, i, j;
    long xoff [30], yoff [30], xref [4], yref [4];

if (debug & 128) printf ("Entering routine display_fiducials\n");
    if (debug & 256) return;
    printf ("Do you wish to display the fiducials just burned? ");
    scanf ("%s", strg);
    if ((strg [0] != 'y') && (strg [0] != 'Y')) return (-1);
    if ((fdr = fopen ("fiducial.via", "r")) <= 0) {
        printf ("Unable to open file fiducial.via for input\n");
        return (0);
    }
    if (debug & 1) printf ("Opened file fiducial.via for input\n");
    fscanf (fdr, "%d", &marks);
    for (i = 0; i < marks; i++) fscanf (fdr, "%ld %ld", &xref [i], &yref [i]);
    fscanf (fdr, "%d", &holes);
    for (i = 0; i < holes; i++) fscanf (fdr, "%ld %ld", &xoff [i], &yoff [i]);
    fclose (fdr);
    for (i = 0; i < marks; i++) {
        move_posit (xref [i], yref [i]);
        move_posit (xref [i], yref [i]);
        for (j = 0; j < 15; j++) delay (10000);
        if (debug & 32) {
            text_position (1, 1);
            scanf ("%s", strg);
        }
    }
}

/***********************************************************************
 *      perform boustrophaedenous scan
 ***********************************************************************/
scan_bous (startx, endx, starty, endy, deltax)
long startx, endx, starty, endy, deltax;
{
    int i, north, savespeed;
    int pingpong, minwait, maxwait, minchunk, maxchunk;
    long x, y, sy, ey, iy;

if (debug & 128) printf ("Entering routine scan_bous\n");
    if ((startx / deltax) & 1) { north = 0; sy = endy   + 2500; }
    else                       { north = 1; sy = starty - 2500; }
    move_posit (startx + xscan_offset, sy + yscan_offset);
    get_rects ();    /* get the first set of rectangles into ara */
    if (ftr > 0) get_traps (); /* get the first set of trapezoids into trap */
    move_posit (startx + xscan_offset, sy + yscan_offset);
    printf ("Please add the flaming massive y weight and enter a number? ");
    scanf ("%s", strg);
    savespeed = step_speed;
    step_speed = 5;
    for (x = startx; x < endx; x += deltax) {
        if (north) {sy = starty; ey = endy;   iy =  256 * divy;}
        else       {sy = endy;   ey = starty; iy = -256 * divy;}
        await_y_stable ();
        move_posit (x + xscan_offset, read_y ());
        printf ("Next x, y at %d, %d\n", ara [1], ara [2]);
        init_scan (starty + yscan_offset, endy + yscan_offset, north);
        skyrout (INITSK);        /* init sky for transfer */
        minwait = 30000;
        maxwait = 0;
        pingpong = 1;
        for (y = sy; y != ey; y += iy) {
            clear_bits (pingpong);
            if (y == sy) test_scan (north, pingpong);
            move_rects (x, y, pingpong);
            if (ftr > 0) move_traps (x, y, pingpong);
            i = sky_sync (pingpong);
            if (i < minwait) {
                minwait = i;
                minchunk = (y - sy) / iy;
            }
            if (i > maxwait) {
                maxwait = i;
                maxchunk = (y - sy) / iy;
            }
            pingpong = 1 - pingpong;
```

```c
        }
        printf ("\nMin, max wait = %5d, %5d at %2d, %2d\n",
            minwait, maxwait, minchunk, maxchunk);
        north = 1 - north;
    }
    await_y_stable ();
    zero_counter ();
    printf ("Please remove the flaming massive y weight and enter a number? ");
    scanf ("%s", strg);
    step_speed = savespeed;
}

/****************************************************************************
 *      Test the scan buffer routine
 ****************************************************************************/
test_scan (direct, ping)
    int     direct, ping;
{
    int i, xpos, ypos, size;

xpos = 2;
    ypos = 0;
    if (debug & 4096) return;
    size = 1;
    if (direct) {
        for (i = 0; i < 5; i++)
            scan_line (text_txt [i], xpos, ypos++, direct, ping, size);
    }
    else {
        scan_line (str_time (), xpos, ypos++, direct, ping, size);
        sprintf (strg, "Files scanned were %s, %s", mtname, trname);
        scan_line (strg         , xpos, ypos++, direct, ping, size);
        sprintf (strg, "Drill offsets were %ld, %ld",
            xdrill_offset, ydrill_offset);
        scan_line (strg         , xpos, ypos++, direct, ping, size);
        sprintf (strg, "Scan offsets were %ld, %ld",
            xscan_offset, yscan_offset);
        scan_line (strg         , xpos, ypos++, direct, ping, size);
    }
}

/****************************************************************************
 *      Scan a line of text onto metal
 ****************************************************************************/
scan_line (string, xpos, ypos, direct, ping, size)
    int xpos, ypos, direct, ping, size;
    char string [];
{
    int i, scn_chr;

for (i = 0;; i++) {
        if ((scn_chr = string [i]) == 0) break;
        if (scn_chr >= ' ')
            scan_char (scn_chr, xpos++, ypos, direct, ping, size);
    }
}

/****************************************************************************
 *      Place a character into the scan buffer
 ****************************************************************************/
scan_char (scn_chr, xpos, ypos, direct, pingpong, size)
    int scn_chr, xpos, ypos, direct, pingpong, size;
{
    int i, j, k, l, base;

scn_chr -= ' ';
    if (pingpong) base = 0x0000;
    else          base = 0x8000;
    if (size == 1) {
        if (direct) base += 0x8000 - 2048 - (ypos << 11) + xpos;
        else        base +=                 (ypos << 11) + xpos;
        for (i = 0; i < 7; i++) {
            k = ascii_dot [scn_chr] [i];
            poke (0x9000, base, k);
            poke (0x9008, base, k);
            if (direct) base -= 256;
            else        base += 256;
        }
    }
    if (size == 2) {
        if (direct) base += 0x8000 - 4096 - (ypos << 12) + (xpos << 1);
        else        base +=                 (ypos << 12) + (xpos << 1);
        for (i = 0; i < 7; i++) {
            k = ascii_dot [scn_chr] [i];
            l = 0;
            for (j = 0; j < 8; j++) {
                l = (l << 2);
                if (k & (1 << (7 - j))) l += 3;
            }
            poke (0x9000, base, l & 255);
            poke (0x9008, base, l & 255);
            poke (0x9010, base, l & 255);
            poke (0x9018, base, l & 255);
            poke (0x9000, base + 1, l >> 8);
            poke (0x9008, base + 1, l >> 8);
```

```c
            poke (0x9010, base + 1, 1 >> 8);
            poke (0x9018, base + 1, 1 >> 8);
            if (direct) base -= 512;
            else        base += 512;
        }
    }
}

/*******************************************************************************
 *          wait for the table to be stable in the y axis
 *******************************************************************************/
await_y_stable ()
{
    long y, read_y ();

for (;;) {
        y = read_y ();
        delay (1000);
        if (y == read_y ()) break;
    }
}

/*******************************************************************************
 *          Clear the TMS320 ram for later use
 *******************************************************************************/
clear_bits (pingpong)
    int pingpong;
{
    if (pingpong) skyrout (CLEARLO);
    else          skyrout (CLEARHI);
}

/*******************************************************************************
 *          copy the current set of rectangles to the SKY320 ram
 *******************************************************************************/
move_rects (xsh, ysh, pingpong)
    int             pingpong;
    long    xsh, ysh;
{
    int numtomov;

numtomov = (ara [0] + 1) << 3;
    if ((xsh == ((long) ara [1] * divx)) &&
        (ysh == ((long) ara [2] * divy))) {
        printf (".");
        if (pingpong) {
            moveb (-1, ara, SKDSEG,      0, numtomov);
            skyrout (LINELO);
        }
        else {
            moveb (-1, ara, SKDSEG, 0x4000, numtomov);
            skyrout (LINEHI);
        }
        get_rects ();
    }
    else printf ("-");
}

/*******************************************************************************
 *          copy the current set of trapezoids to the SKY320 ram
 *******************************************************************************/
move_traps (xsh, ysh, pingpong)
    int             pingpong;
    long    xsh, ysh;
{
    int numtomov;

numtomov = 8 + trap [0] * 12;
    sky_wait ();
    if ((xsh == ((long) trap [1] * divx)) &&
        (ysh == ((long) trap [2] * divy))) {
        printf (".");
        if (pingpong) {
            moveb (-1, trap, SKDSEG,      0, numtomov);
            skyrout (TRAPLO);
        }
        else {
            moveb (-1, trap, SKDSEG, 0x4000, numtomov);
            skyrout (TRAPHI);
        }
        get_traps ();
    }
    else printf ("_");
}

/*******************************************************************************
 *          copy the current set of rectangles from disk to ara
 *******************************************************************************/
get_rects ()
{
    int i, j, k, l;

i = fread (&ara [0], sizeof (int), 4, fmt);
    if (debug & 32) printf ("Read in %d values, x, y= %d %d\n",
        i, ara [1], ara [2]);
```

```
        j = ((ara [0] + 1) << 2) - 4;
        k = fread (&ara [4], sizeof (int), j, fmt);
        if (debug & 64) {
            for (l = 4; l <= j; l += 4) {
                printf ("%3d    %4d %4d %4d %4d\n",
                    l, ara[l], ara[l+1], ara[l+2], ara[l+3]);
            }
        }
        return (k);
}

/*******************************************************************************
*       copy the current set of trapezoids from disk to trap
*******************************************************************************/
get_traps ()
{
    int i, j, k, l;

i = fread (&trap [0], sizeof (int), 4, ftr);
    if (debug & 32) printf ("Read in %d values, x, y= %d %d\n",
        i, trap [1], trap [2]);
    j = trap [0] * 6;
    k = fread (&trap [4], sizeof (int), j, ftr);
    if (debug & 64) {
        for (l = 4; l <= j; l += 4) {
            printf ("%3d    %4d %4d %4d %4d\n",
                l, trap [l], trap [l+1], trap [l+2], trap [l+3]);
        }
    }
    return (k);
}

/*******************************************************************************
*       Get the drill hole coordinates of the next IC in x_file, y_file
*******************************************************************************/
get_ic_holes (ic)
    int ic;
{
    int j;
    long x, y;
    char strg [20];

if (debug & 128) printf ("Entering routine get_ic_holes\n");
    for (;;) {
        fscanf (fdr, "%d", &maxpins);
        if (maxpins) break;
        fscanf (fdr, "%ld %ld", &x, &y);
    }
    if (maxpins < 0) return (0);           /* quit with 0 if eof */
    fscanf (fdr, "%s %ld %ld", strg, &x_cntrd [ic], &y_cntrd [ic]);
    for (j = 0; j < maxpins; j++)
        fscanf (fdr, "%ld %ld", &x_file [j], &y_file [j]);
    return (1);
}

/*******************************************************************************
*       Align ic number ic by filling x_offset, y_offset, ic_rot
*******************************************************************************/
align_ic (ic)
    int ic;
{
    int pin, pin_a, pin_b;
    long x, y, d, maxd;

if (debug & 128) printf ("Entering routine align_ic\n");
    x_offset [ic] = y_offset [ic] = 0;
    ic_rot [ic] = 0;
    maxd = 0;
    for (pin = 0; pin < maxpins; pin++) {
        x = x_file [pin] - x_cntrd [ic];
        y = y_file [pin] - y_cntrd [ic];
        d = x * x + y * y;
        if (d > maxd) {
            maxd = d;
            pin_a = pin;
        }
    }
    maxd = 0;
    for (pin = 0; pin < maxpins; pin++) {
        x = x_file [pin] - x_file [pin_a];
        y = y_file [pin] - y_file [pin_a];
        d = x * x + y * y;
        if (d > maxd) {
            maxd = d;
            pin_b = pin;
        }
    }
    pin_cursor (pin_a);
    x = x_file [pin_a] + x_offset [0];
    y = y_file [pin_a] + y_offset [0];
    move_posit (x, y);
    move_posit (x, y);
    move_til_button ();
    update_best_guess (ic, pin_a, pin_b, 1);
    pin_cursor (pin_a);
```

```
                pin_cursor (pin_b);
                get_best_guess (ic, pin_b, &x, &y);
                move_posit (x, y);
                move_posit (x, y);
                move_til_button ();
                update_best_guess (ic, pin_a, pin_b, 2);
                pin_cursor (pin_b);
                if (debug & 16) {
                        for (pin = 0; pin < maxpins; pin++) {
                                pin_cursor (pin);
                                get_best_guess (ic, pin, &x, &y);
                                move_posit (x, y);
                                move_posit (x, y);
                                delay (3000);
                                pin_cursor (pin);
                        }
                }
        }

/******************************************************************************
*       Get the best guess actual corrected position for this pin
******************************************************************************/
get_best_guess (ic, pin, x, y)
        int ic, pin;
        long *x, *y;
{
        if (debug & 128) printf ("Entering routine goto_best_guess\n");
        *x=x_file[pin]+x_offset[ic]+ic_rot[ic]*(y_file[pin]-y_file[ref_pin[ic]]);
        *y=y_file[pin]+y_offset[ic]-ic_rot[ic]*(x_file[pin]-x_file[ref_pin[ic]]);
}

/******************************************************************************
*       Correct the best guess for this ic based on this pin
******************************************************************************/
update_best_guess (ic, pin_a, pin_b, type)
        int ic, pin_a, pin_b, type;
{
        float x_theta, y_theta;

if (debug & 128) printf ("Entering routine update_best_guess\n");
        if (type == 1) {
                x_offset [ic] = read_x () - x_file [pin_a];
                y_offset [ic] = read_y () - y_file [pin_a];
                ref_pin [ic] = pin_a;
        }
        if (type == 2) {
                x_theta = read_x () - x_file [pin_b] - x_offset [ic];
                y_theta = read_y () - y_file [pin_b] - y_offset [ic];
                ic_rot [ic] = (x_theta - y_theta) /
                        (y_file[pin_b] - y_file[pin_a] + x_file[pin_b] - x_file[pin_a]);
                if (debug & 2048) {
                        text_position (1, 1);
                        printf ("xy off %ld %ld, rot %f %f", x_offset [ic], y_offset [ic],
                                x_theta, y_theta);
                }
        }
}

/******************************************************************************
*       Input the parameters to provide default values
******************************************************************************/
get_params (argc, argv)
        int argc;
        char *argv[];
{
        int i, j;

step_speed = substnum = layer = basename [0] = debug = 0;
        diag_msg = stp_test = 0;
        rstr_offset = 2;
        fusec = usec = 10000;
        for (i = 1; i < argc; i++) {
                if (argv [i] [0] == '-') { switch (argv [i] [1]) {
                        case 'd': case 'D': /* enter a debug value */
                                debug = atoi (&argv [i] [2]);
                                break;
                        case 'f': case 'F': /* fast initialize, skip DT2803 init */
                                debug |= 8;
                                break;
                        case 'h': case 'H': /* change the hole profile file name */
                                for (j = 0; j < 20; j++)
                                        if (0 == (profile_name [j] = argv [i] [j+2])) break;
                                break;
                        case 'l': case 'L': /* list a diagnostic message */
                                diag_msg = atoi (&argv [i] [2]);
                                break;
                        case 'm': case 'M': /* slow down the stepper */
                                step_speed = atoi (&argv [i] [2]);
                                break;
                        case 'r': case 'R': /* define the raster offset */
                                rstr_offset = atoi (&argv [i] [2]);
                                break;
                        case 's': case 'S': /* enter a stepper test value */
                                stp_test = atoi (&argv [i] [2]);
                                break;
```

```c
            case 'y': case 'Y': /* enter a fiducial zap value */
                fusec = atoi (&argv [i] [2]);
                break;
            default:
                printf ("Unrecognized switch %s as parameter %d\n",argv[i],i);
                break;
            }
        else for (j = 0; j < 10; j++)
            if (0 == (basename [j] = argv [i] [j]))
                break;
    }
}

/***************************************************************************
*       Initialize the system
***************************************************************************/
init_sys ()
{
    int i, j, k, l, m, n;
    long q;
    float temp;
    FILE *ftable;

if (debug & 128) printf ("Entering routine init_sys\n");
    if (basename [0] == 0) {
        printf ("What is the base name of the circuit file? ");
        scanf ("%s", basename);
    }
    concat (basename, ".adp", mtname);
    if ((fdr = fopen (mtname, "r")) > 0) {
        fscanf (fdr, "%d %f", &j, &temp);
        for (i = 0; i < j; i++) {
            fscanf (fdr, "%ld %ld %ld %ld", &q, &q, &q, &q);
            fscanf (fdr, "%ld %ld %ld %ld", &q, &q, &q, &q);
            fscanf (fdr, "%ld %ld"         , &q, &q        );
        }
        fscanf (fdr, "%ld %ld %ld %ld %ld", &q, &q, &q, &q, &q);
        fscanf (fdr, "%d %d", &divx, &divy);
    }
    else {
        printf ("Failed to open file %s, hit ^c to start over\n", mtname);
        scanf ("%s", strg);
    }
    if ((fdr = fopen ("ascii.dot", "r")) <= 0) {
        printf ("Failed to open file ascii.dot for input, c.line 1243\n");
    }
    else {
        fscanf (fdr, "%d", &k);
        for (i = 0; i < k; i++) {
            for (j = 0; j < 7; j++) {
                fscanf (fdr, "%x", &l);
                n = 0;
                for (m = 0; m < 5; m++) {
                    n = (n << 1) | (l & 1);
                    l = l >> 1;
                }
                ascii_dot [i] [j] = n;
            }
        }
        fclose (fdr);
    }
    if ((fdr = fopen (profile_name, "r")) <= 0) {
        printf ("Failed to open file %s for input, c.line 1261\n",
            profile_name);
        hole[0].repeat = 1;
        hole[0].x = hole[0].y = 0;
        hole[0].on  = 10000;
        hole[0].off = 10000;
        max_hole = 1;
    }
    else {
        printf ("Using %s for hole profiles\n", profile_name);
        for (i = 0; i < MAX_HOLE; i++) {
            if (EOF == fscanf (fdr, "%d %d %d %d %d",
                &hole[i].repeat, &hole[i].x, &hole[i].y,
                &hole[i].on, &hole[i].off) ) break;
        }
        if (i >= MAX_HOLE) printf ("File %s too large\n", profile_name);
        fclose (fdr);
        max_hole = i;
    }
    printf ("Drilling %d set of holes for each via\n", max_hole);
    xscan_offset = yscan_offset = xdrill_offset = ydrill_offset = 0;
    ftable = fopen ("table.aln", "r");
    if (ftable > 0) {
        fscanf (ftable, "%ld %ld", &xscan_offset, &yscan_offset );
        fscanf (ftable, "%ld %ld", &xdrill_offset, &ydrill_offset);
        fscanf (ftable, "%d", &maxbreak);
        for (j = 0; j < maxbreak; j++) fscanf (ftable, "%ld %d",
            &x_break_pnt [j], &x_error [j]);
        fclose (ftable);
    }
    get_rantext ();
}
```

```
/****************************************************************************
*       Get the random text
****************************************************************************/
get_rantext ()
{
    int i, j;
    FILE *ftable;

j = random (100);
    text_txt [0] [0] = 0;
    ftable = fopen ("text.txt", "r");
    if (ftable > 0) {
        j *= 6;
        for (i = 0; i < j; i++) fgets (text_txt [0], 80, ftable);
        for (i = 0; i < 5; i++) fgets (text_txt [i], 80, ftable);
        fclose (ftable);
    }
}

/****************************************************************************
*       Get the substrate number and create subsname
****************************************************************************/
get_substnum (type)
    int type;
{
    int i, j, k, exists;

for (;;) {
        if (substnum == 0) {
            printf ("Which substrate number? ");
            scanf ("%d", &substnum);
        }
        k = substnum;
        for (i = 0; i < 3; i++) {
            j = k / 10;
            nmext [3 - i] = '0' + k - 10 * j;
            k = j;
        }
        concat (basename, nmext, subsname);
        if ((fsubstrate = fopen (subsname, "r")) > 0) {
            exists = 1;
            fclose (fsubstrate);
        }
        else exists = 0;
        if (type == exists) break;
        if (exists) printf ("File %s already exists\n", subsname);
        else       printf ("File %s does not exist\n", subsname);
        printf ("Do you wish a new number (y/n)? ");
        scanf ("%s", strg);
        if ((strg [0] != 'y') && (strg [0] != 'Y')) break;
        substnum = 0;
    }
}

/****************************************************************************
*       Return a random number between 0 and argument
****************************************************************************/
random (limit)
    int limit;
{
    long ltime;

time (<ime);
    limit = ltime % limit;
    return (limit);
}

/****************************************************************************
*       Return the current time and date in a string
****************************************************************************/
char *str_time ()
{
    long ltime;

time (<ime);
    return (ctime (<ime));
}

/****************************************************************************
*       Show the chips on the crt
****************************************************************************/
show_chips ()
{
    int pins, ix, iy;
    long xmax = 0, ymax = 0, xmin = 20000, ymin = 20000;

if (debug & 128) printf ("Entering routine show_chips\n");
    rewind (fdr);
    while (get_ic_holes ()) {
        for (pins = 0; pins < maxpins; pins++) {
            if (x_file [pins] < xmin) xmin = x_file [pins];
            if (y_file [pins] < ymin) ymin = y_file [pins];
            if (x_file [pins] > xmax) xmax = x_file [pins];
            if (y_file [pins] > ymax) ymax = y_file [pins];
        }
    }
```

```
    printf ("Drill limits are %ld %ld %ld %ld\n", xmin, xmax, ymin, ymax);
    b = -xmin + (xmax - xmin) / 50;
    c = -ymin + (ymax - ymin) / 50;
    ax = (xmax - xmin) / 300;
    if (ax < ((ymax - ymin) / 180)) ax = (ymax - ymin) / 180;
    clear_graphics (1);
    rewind (fdr);
    while (get_ic_holes ()) {
        for (pins = 0; pins < maxpins; pins++) {
            ix = (x_file [pins] + b) / ax;
            iy = (y_file [pins] + c) / ax;
            ibm_crt (ix, iy, 170);
        }
    }
    rewind (fdr);
}

/********************************************************************************
*       Draw a cursor on pin
********************************************************************************/
pin_cursor (pin)
    int pin;
{
    int i, x, y;

x = (x_file [pin] + b) / ax;
    y = (y_file [pin] + c) / ax;
    for (i = - 5; i < 6; i++) {
        ibm_crt (x + i, y + i, 341);
        ibm_crt (x + i, y - i, 341);
    }
}

/********************************************************************************
*       generate a microsecond time delay
********************************************************************************/
micro_pause (delayval)
    int delayval;
{
    int i, dummy;

for (i = 0; i < delayval; i++) dummy = i + i;
}

/********************************************************************************
*       generate a dummy time delay
********************************************************************************/
delay (delayval)
    int delayval;
{
    int i, dummy;

for (i = 0; i < delayval; i++) dummy = i + i;
}

/********************************************************************************
*       concatenate 2 strings into a third, max length 40
********************************************************************************/
concat (sa, sb, sc)
    char sa [], sb [], sc [];
{
    int i, j;

if (debug & 128) printf ("Entering routine concat\n");
    for (i = 0; i < 40; i++) if ((sc [i] = sa [i]) == 0) break;
    for (j = 0; j < 40; j++) {
        if ((sc [i + j] = sb [j]) == 0) break;
        if ((i + j) >= 39) break;
    }
    return (i + j);
}

/********************************************************************************
*       Initialize all of the hardware
********************************************************************************/
init_hdw ()
{
    if (debug & 128) printf ("Entering routine init_hdw\n");
    clear_graphics (0);
    imouse ();
    init_motor ();
    init_skydt ();
}
```

APPENDIX C

Listing 3

Copyright rights in this program and derivatives in both form and language nonetheless are vested in the assignee.

```
/****************************************************************************
*           Title     CGV.C
*           Author    R.2 Welles
*           Date      1/ 7/86
*           c.date       Fri Dec 12 08:39:44 1986
*           Lang      Microsoft C       (IBM PC)
*           Lang      C                 (SUN)
*           (c)       Copyright 1985 General Electric
*           Batch     CGC               (IBM PC edit, compile, link)
*           Compile   MSC CGV,;         (IBM PC)
*                     LINK CGV,;
*           Compile   cgc               (SUN compile, link)
****************************************************************************/

/****************************************************************************
*                             INPUT FILES
* base.adp       Reference file for ic locations and boundaries
* base.in1       Inside file of rectangles completely within each ic
* base.br1       Bridge file of rectangles spanning the adjustment area
*      %d %ld %ld %ld %ld   icnum, xminu, yminu, xmaxu, ymaxu
* base.vi1       Sorted absolute drill co-ordinates
*      %d %s %ld %ld %ld    pins, icname, xcentroidu, ycentroidu
*      %ld %ld              xabsu, yabsu
*    - 0 %ld %ld            xabsu, yabsu  of a non-pad via
*      -1 -1 -1 eof         eof
* base.001       Offsets and rotations for substrate 001
*      %d %d %d %f          icnumber, xoffset, yoffset, rotation (radians)
*
*                             OUTPUT FILES
* base001.tr1    Trapezoid files for substrate 001
*
****************************************************************************/

/****************************************************************************
*           DEBUG  VALUES
****************************************************************************
* BIT    FUNCTION
*   1    Type all file names as they are opened
*   2    Do not trapezoid the inside traces
*   4    Do not trapezoid the bridge traces
*   8    Trapezoid only according to trap_level
*  16    debug the bit file making
*  64    debug the bit file making
* 128    Show major routines as entered
* 256    Debug the trapezoid output routine
****************************************************************************/ include "stdio.h"
include "localcpu.h"
/****************************************************************************
*           GLOBAL VALUES AND VARIABLES
****************************************************************************/
#define LOWERX        0
#define LOWERY        0
#define UPPERX   100000L
#define UPPERY    76799L
#define SIZX       1024
#define SIZY        256
#define MAXIC        20
#define MAXTR     20000
    FILE *fadp, *finside, *fbridge, *ftrap, *fdiag;
    int icnumber, maxic, xdiv, ydiv, chnkx, chnky;
    int ixlchunk, iylchunk, ixuchunk, iyuchunk, dchunk, nchunk;
    int xoffset [MAXIC], yoffset [MAXIC];
    int trapbuf [MAXTR], trappnt, trapmisd, traphit;
    long trap_level, debug, lox, loy, upx, upy, stepx;
    long xref [MAXIC], yref [MAXIC], xadbnd [MAXIC] [4], yadbnd [MAXIC] [4];
    long mmxy [8], xmin, ymin, xmax, ymax;
    long lxlchunk, lylchunk, lxuchunk, lyuchunk;
    char basename [10], trapname [10];
    float rotate [MAXIC], fxydif;
    static char *subext = "001";
    static char *extinside  [] = {"in1", "in2", "in3"};
    static char *extbridge  [] = {"br1", "br2", "br3"};
    static char *exttrap    [] = {"tr1", "tr2", "tr3"};

char *ccat (), *lcase ();

/****************************************************************************
*           Main routine
****************************************************************************/
main (argc, argv)
    int argc;
    char *argv [];
{
    get_params (argc, argv);
    initsys ();
    read_adp_file ();
    make_trap_files ();
}

/****************************************************************************
*           Read the reference file and get any non-default parameters
****************************************************************************/
```

```c
read_adp_file ()
{
    int i, j;

if (debug & 128) printf ("Entering routine read_adp_file\n");
    if (basename [0] == 0) {
        printf ("Base name of file to read (.adp added)? ");
        scanf ("%s", basename);
        for (i = 0; i < 10; i++)
            if (0 == basename [i]) break;
        basename [i++] = '.';
        basename [i  ] = 0;
    }
    if (debug & 1) printf ("Reading file %s\n", ccat (basename, "adp"));
    if ((fadp = fopen (ccat(basename, "adp"), "r")) <= 0 ) {
        printf ("Cannot open %s c.line 111\n", ccat (basename, "adp"));
        return (0);
    }
    fscanf (fadp, "%d %f", &maxic, &fxydif);
    for (i = 0; i < maxic; i++) {
        fscanf (fadp, "%ld %ld %ld %ld", &xadbnd [i] [0], &xadbnd [i] [1],
            &xadbnd [i] [2], &xadbnd [i] [3]);
        fscanf (fadp, "%ld %ld %ld %ld", &yadbnd [i] [0], &yadbnd [i] [1],
            &yadbnd [i] [2], &yadbnd [i] [3]);
        fscanf (fadp, "%ld %ld", &xref [i], &yref [i]);
    }
    fscanf (fadp, "%ld %ld %ld %ld %ld", &lox, &loy, &upx, &upy, &stepx);
    fscanf (fadp, "%d %d", &xdiv, &ydiv);
    chnkx = SIZX * xdiv;
    chnky = SIZY * ydiv;
    fclose (fadp);
    xmax = xmin + 1. / fxydif;
    ymax = ymin + 1. / fxydif;
    if (debug & 1) printf ("Reading file %s\n", ccat (basename, subext));
    if ((fadp = fopen (ccat(basename, subext), "r")) <= 0 ) {
        printf ("Cannot open %s c.line 131\n", ccat (basename, subext));
        return (0);
    }
    for (i = 0; i < maxic; i++) {
        fscanf (fadp, "%d %d %d %f", &j, &xoffset [i], &yoffset [i],
            &rotate [i]);
    }
    fclose (fadp);
    for (i = 0; i < 10; i++) if ('.' == (trapname [i] = basename [i])) break;
    for (j = 0; j <  4; j++) if (0 == (trapname [j + i] = subext [j])) break;
    trapname [j + i] = '.';
    trapname [j+i+1] = 0;
    return (1);
}

/****************************************************************************
*       Make the trapezoid  files of rotated metal
****************************************************************************/
make_trap_files ()
{
    int i, ic;
    long lowerx, upperx, lowery, uppery;
    long lsminx, lsmaxx, lsminy, lsmaxy;

if (debug & 128) printf ("Entering routine make_trap_files\n");
    lsminx = lsmaxx = xadbnd [0] [0];
    lsminy = lsmaxy = yadbnd [0] [0];
    for (ic = 0; ic < maxic; ic++) {
        if (lsminx > xadbnd [ic] [0]) lsminx = xadbnd [ic] [0];
        if (lsminy > yadbnd [ic] [0]) lsminy = yadbnd [ic] [0];
        if (lsmaxx < xadbnd [ic] [3]) lsmaxx = xadbnd [ic] [3];
        if (lsmaxy < yadbnd [ic] [3]) lsmaxy = yadbnd [ic] [3];
    }
    for (i = 0; i < 3; i++) {
        if (debug & 1) printf ("Reading file %s\n", ccat (basename, "inX"));
        finside = fopen (ccat (basename, extinside [i]), "r");
        if (debug & 1) printf ("Reading file %s\n", ccat (basename, "brX"));
        fbridge = fopen (ccat (basename, extbridge [i]), "r");
        traphit = trapmisd = 0;
        if ((finside > 0) && (fbridge > 0)) {
            ftrap = fopen (ccat (trapname, exttrap [i]), "w+b");
            nchunk = 0;
            if (fdiag) fprintf (fdiag, "Starting chunk %d\n", nchunk);
            if (debug & 1) printf ("Writing file %s %d\n",
                ccat (trapname, exttrap [i]), ftrap);
            if (debug & 16) {
                printf ("lox = %ld, loy = %ld, upx = %ld, upy =%ld\n",
                    lox, loy, upx, upy);
                printf ("lsmin = %ld %ld, lsmax = %ld %ld\n",
                    lsminx, lsminy, lsmaxx, lsmaxy);
            }
            for (lowerx = lox; lowerx <= upx; lowerx += stepx) {
                upperx = lowerx + chnkx - xdiv;
                if (debug & 64) printf ("lowerx %ld, upperx %ld\n",
                    lowerx, upperx);
                if ((lowerx <= lsmaxx) && (upperx >= lsminx)) {
                    for (lowery = loy; lowery <= upy; lowery += chnky) {
                        uppery = lowery + chnky - ydiv;
                        if (debug & 64) printf ("lowery %ld, uppery %ld\n",
                            lowery, uppery);
```

```
                    if ((lowery <= lsmaxy) && (uppery >= lsminy))
                        sort_traps (lowerx,lowery,upperx,uppery,0);
            }
            lowerx += stepx;
            upperx = lowerx + chnkx - xdiv;
            if (debug & 64) printf ("lowerx %ld, upperx %ld\n",
                    lowerx, upperx);
            if ((lowerx <= lsmaxx) && (upperx >= lsminx)) {
                for (uppery = upy; uppery >= loy; uppery -= chnky) {
                    lowery = uppery - chnky + ydiv;
                    if (debug & 64) printf ("lowery %ld, uppery %ld\n",
                            lowery, uppery);
                    if ((lowery <= lsmaxy) && (uppery >= lsminy))
                        sort_traps (lowerx,lowery,upperx,uppery,1);
                }
            }
        }
        fclose (ftrap);
        printf ("%6d trapezoids hit, %4d missed\n", traphit, trapmisd);
    }
    if (fbridge > 0) fclose (fbridge);
    if (finside > 0) fclose (finside);
    if (fdiag   > 0) fclose (fdiag  );
}

/****************************************************************************
 *     Sort this scan chunk for all bridge and inside files
 ****************************************************************************/
sort_traps (lowerx, lowery, upperx, uppery, direct)
    int direct;
    long lowerx, lowery, upperx, uppery;
{
    int ic, j, ic_hit [MAXIC];
    long xxl, yyl, xxu, yyu;

if (debug & 128) printf ("Entering routine sort_traps\n");
    ixlchunk = (lxlchunk = lowerx) / xdiv;
    iylchunk = (lylchunk = lowery) / ydiv;
    ixuchunk = (lxuchunk = upperx) / xdiv;
    iyuchunk = (lyuchunk = uppery) / ydiv;
    dchunk = direct;
    j = 0;
    trappnt = 4;
    for (ic = 0; ic < maxic; ic++) {
        j |= (ic_hit [ic] = hit_this_ic (ic));
    }
    if (j) {
        rewind (finside);
        while (EOF != fscanf (finside, "%d %ld %ld %ld %ld", &ic,
                &xxl, &yyl, &xxu, &yyu)) {
            if ((ic_hit [ic]) && ((debug & 2) == 0)) {
                convert (&mmxy [0], ic, xxl, yyl);
                convert (&mmxy [2], ic, xxl, yyu);
                convert (&mmxy [4], ic, xxu, yyu);
                convert (&mmxy [6], ic, xxu, yyl);
                set_traps (mmxy);
            }
        }
        rewind (fbridge);
        while (EOF != fscanf (fbridge, "%d %ld %ld %ld %ld", &ic,
                &xxl, &yyl, &xxu, &yyu)) {
            if ((ic_hit [ic]) && ((debug & 4) == 0)) {
                if (xxl < xadbnd [ic] [1]) {
                    mmxy [0] = xadbnd [ic] [0]; mmxy [1] = yyl;
                    mmxy [2] = xadbnd [ic] [0]; mmxy [3] = yyu;
                    convert (&mmxy [4], ic, xadbnd [ic] [1], yyu);
                    convert (&mmxy [6], ic, xadbnd [ic] [1], yyl);
                }
                else if (yyl < yadbnd [ic] [1]) {
                    mmxy [0] = xxl; mmxy [1] = yadbnd [ic] [0];
                    convert (&mmxy [2], ic, xxl, yadbnd [ic] [1]);
                    convert (&mmxy [4], ic, xxu, yadbnd [ic] [1]);
                    mmxy [6] = xxu; mmxy [7] = yadbnd [ic] [0];
                }
                else if (xxu > xadbnd [ic] [2]) {
                    convert (&mmxy [0], ic, xadbnd [ic] [2], yyl);
                    convert (&mmxy [2], ic, xadbnd [ic] [2], yyu);
                    mmxy [4] = xadbnd [ic] [3]; mmxy [5] = yyu;
                    mmxy [6] = xadbnd [ic] [3]; mmxy [7] = yyl;
                }
                else if (yyu > yadbnd [ic] [2]) {
                    convert (&mmxy [0], ic, xxl, yadbnd [ic] [3]);
                    mmxy [2] = xxl; mmxy [3] = yadbnd [ic] [3];
                    mmxy [4] = xxu; mmxy [5] = yadbnd [ic] [3];
                    convert (&mmxy [6], ic, xxu, yadbnd [ic] [2]);
                }
                set_traps (mmxy);
            }
        }
        if (trappnt > 4) {
            trapbuf [0] = (trappnt - 4) / 6;
            trapbuf [1] = ixlchunk;
            trapbuf [2] = iylchunk + (dchunk & 1) * (chnky / ydiv);
            trapbuf [3] = dchunk;
```

```
            fwrite (trapbuf, sizeof (int), trappnt, ftrap);
            nchunk++;
            if (fdiag) fprintf (fdiag, "Starting chunk %d\n", nchunk);
        }
    }
}

/*****************************************************************************
*       Find out if this ic (ic) is hit by this chunk
*****************************************************************************/
hit_this_ic (ic)
    int ic;
{
    if (xadbnd [ic] [3] < lxlchunk) return (0);
    if (yadbnd [ic] [3] < lylchunk) return (0);
    if (xadbnd [ic] [0] > lxuchunk) return (0);
    if (yadbnd [ic] [0] > lyuchunk) return (0);
    return (1);
}

/*****************************************************************************
*       Make the trapezoids in mxy into other trapezoids in this chunk
*****************************************************************************/
set_traps (mxy)
    long mxy [];
{
    long x1, y1, x2, y2, x3, y3, x4, y4, lx, rx;
    float f12, f23, f34, f41, f;

if ((mxy [0] > lxuchunk) && (mxy [2] > lxuchunk)) return;
    if ((mxy [4] < lxlchunk) && (mxy [6] < lxlchunk)) return;
    if ((mxy [1] > lyuchunk) && (mxy [7] > lyuchunk)) return;
    if ((mxy [3] < lylchunk) && (mxy [5] < lylchunk)) return;
    if (mxy [1] <= mxy [7]) {
        x1 = mxy [0] / xdiv;
        y1 = mxy [1] / ydiv;
        x2 = mxy [2] / xdiv;
        y2 = mxy [3] / ydiv;
        x3 = mxy [4] / xdiv;
        y3 = mxy [5] / ydiv;
        x4 = mxy [6] / xdiv;
        y4 = mxy [7] / ydiv;
    }
    else {
        x1 = mxy [6] / xdiv;
        y1 = mxy [7] / ydiv;
        x2 = mxy [0] / xdiv;
        y2 = mxy [1] / ydiv;
        x3 = mxy [2] / xdiv;
        y3 = mxy [3] / ydiv;
        x4 = mxy [4] / xdiv;
        y4 = mxy [5] / ydiv;
    }
    if (y1 != y2) {
        f = y1 - y2;
        f12 = (x1 - x2) / f;
    }
    else f12 = 0.;
    if (y2 != y3) {
        f = y2 - y3;
        f23 = (x2 - x3) / f;
    }
    else f23 = 0.;
    if (y3 != y4) {
        f = y3 - y4;
        f34 = (x3 - x4) / f;
    }
    else f34 = 0.;
    if (y4 != y1) {
        f = y4 - y1;
        f41 = (x4 - x1) / f;
    }
    else f41 = 0.;
    if (y4 != y1) {
        if (y2 < y4) {
            trap_fill (y1, y2, x1, x1, f12, f41);
            rx = x1 + (y2 - y1) * f41;
            if (y3 >= y4) {
                trap_fill (y2, y4, x2, rx, f23, f41);
                if (y3 > y4) {
                    lx = x2 + (y4 - y2) * f23;
                    trap_fill (y4, y3, lx, x4, f23, f34);
                }
            }
            else printf ("Trapezoid error on c.line 371\n");
        }
        if (y2 > y4) {
            trap_fill (y1, y4, x1, x1, f12, f41);
            lx = x1 + (y4 - y1) * f12;
            if (y3 >= y2) {
                trap_fill (y4, y2, lx, x4, f12, f34);
                if (y3 > y2) {
                    rx = x4 + (y2 - y4) * f34;
                    trap_fill (y2, y3, x2, rx, f23, f34);
                }
            }
```

```
            else printf ("Trapezoid error on c.line 383\n");
        }
        if (y2 == y4) {
            trap_fill (y1, y2, x1, x1, f12, f41);
            trap_fill (y2, y3, x2, x4, f23, f34);
        }
    }
    if (y1 == y4) {
        if (y2 < y3) {
            trap_fill (y1, y2, x1, x4, f12, f34);
            rx = x4 + (y2 - y4) * f34;
            trap_fill (y2, y3, x2, rx, f23, f34);
        }
        if (y2 > y3) {
            trap_fill (y1, y3, x1, x4, f12, f34);
            lx = x1 + (y3 - y1) * f12;
            trap_fill (y3, y2, lx, x3, f12, f23);
        }
        if (y2 == y3) trap_fill (y1, y2, x1, x4, f12, f34);
    }
}

/****************************************************************************
*       Make a trapezoid that the TMS320 can fill
****************************************************************************/
trap_fill (starty, endy, leftx, rightx, flxly, frxry)
    long starty, endy, leftx, rightx;
    float flxly, frxry;
{
    long slx, elx, srx, erx, temp, ibit, ily, iry;

if (debug & 256) printf ("%ld %ld %ld %ld %f %f %d %d\n", starty, endy,
        leftx, rightx, flxly, frxry, iylchunk, iyuchunk);
    if (starty > iyuchunk) return;
    if (endy   < iylchunk) return;
    slx = leftx  - ixlchunk;
    srx = rightx - ixlchunk;
    elx = slx + (endy - starty) * flxly + .5;
    erx = srx + (endy - starty) * frxry + .5;
    if (endy   > iyuchunk) {
        elx = slx + (iyuchunk - starty) * flxly + .5;
        erx = srx + (iyuchunk - starty) * frxry + .5;
        endy = iyuchunk;
    }
    if (starty < iylchunk) {
        slx = slx + (iylchunk - starty) * flxly + .5;
        srx = srx + (iylchunk - starty) * frxry + .5;
        starty = iylchunk;
    }
    starty -= iylchunk;
    endy   -= iylchunk;
    if (dchunk) {
        temp = slx; slx = elx; elx = temp;
        temp = srx; srx = erx; erx = temp;
        temp = starty; starty = endy; endy = temp;
        starty = SIZY - 1 - starty;
        endy   = SIZY - 1 - endy  ;
        flxly = -flxly;
        frxry = -frxry;
    }
    if ((slx >= SIZX) && (elx >= SIZX)) return;
    if ((srx <  0   ) && (erx <  0   )) return;
    if ((slx <  0   ) && (elx >= 0   )) slx = elx = flxly = 0;
    if ((srx >= SIZX) && (erx >= SIZX)) { srx = erx = SIZX - 1; frxry = 0; }
    ibit = 0;
    if (slx <      0) ibit |=   1;
    if (slx >= SIZX) ibit |=   2;
    if (elx <      0) ibit |=   4;
    if (elx >= SIZX) ibit |=   8;
    if (srx <      0) ibit |=  16;
    if (srx >= SIZX) ibit |=  32;
    if (erx <      0) ibit |=  64;
    if (erx >= SIZX) ibit |= 128;
    if (endy - starty) {
        flxly = elx - slx;
        flxly = flxly / (endy - starty);
        frxry = erx - srx;
        frxry = frxry / (endy - starty);
    }
    else {
        flxly = frxry = 1.;
        printf ("endy = starty = %ld error on c.line 464\n", endy);
        printf ("startxl, r = %ld %ld, endxl, r = %ld %ld\n",
            slx, srx, elx, erx);
        printf ("ibit = %ld, chunk = %d, trap # = %d\n", ibit, nchunk,
            (trappnt - 4) / 6);
    }
    if (fdiag) fprintf (fdiag, "ibit %ld ", ibit);
    switch (ibit) {
      case 0:
        if ((debug & 8) && (trap_level & 1)) break;
        trap_write (ibit, starty, endy, slx, srx, flxly, frxry);
        break;
      case 1:
        if ((debug & 8) && (trap_level & 2)) break;
        ily = starty - slx / flxly + .5;
```

```
            slx = 0;
            trap_write (ibit, starty, ily, slx, srx, 0.0, frxry);
            srx = srx + frxry * (ily - starty);
            trap_write (ibit, ily, endy, slx, srx, flxly, frxry);
            break;
        case 2:
            if ((debug & 8) && (trap_level & 4)) break;
            ily = starty - (slx - SIZX + 1) / flxly + .5;
            slx = SIZX - 1;
            trap_write (ibit, ily, endy, slx, srx, flxly, frxry);
            break;
        case 4:
            if ((debug & 8) && (trap_level & 8)) break;
            ily = starty - slx / flxly + .5;
            trap_write (ibit, starty, ily, slx, srx, flxly, frxry);
            slx = 0;
            srx = srx + frxry * (ily - starty);
            trap_write (ibit, ily, endy, slx, srx, 0.0, frxry);
            break;
        case 8:
            if ((debug & 8) && (trap_level & 16)) break;
            ily = starty - (slx - SIZX + 1) / flxly + .5;
            trap_write (ibit, starty, ily, slx, srx, flxly, frxry);
            break;
        case 16:
            if ((debug & 8) && (trap_level & 32)) break;
            iry = starty - srx / frxry + .5;
            srx = 0;
            trap_write (ibit, iry, endy, slx, srx, flxly, frxry);
            break;
        case 17:
            if ((debug & 8) && (trap_level & 32)) break;
            ily = starty - slx / flxly + .5;
            iry = starty - srx / frxry + .5;
            slx = 0;
            trap_write (ibit, iry, ily, slx, slx, 0.0, frxry);
            srx = srx + frxry * (ily - starty);
            trap_write (ibit, ily, endy, slx, srx, flxly, frxry);
            break;
        case 32:
            if ((debug & 8) && (trap_level & 64)) break;
            iry = starty - (srx - SIZX + 1) / frxry + .5;
            srx = SIZX - 1;
            trap_write (ibit, starty, iry, slx, srx, flxly, 0.0);
            trap_write (ibit, iry, endy, slx, srx, flxly, frxry);
            break;
        case 34:
            if ((debug & 8) && (trap_level & 64)) break;
            ily = starty - (slx - SIZX + 1) / flxly + .5;
            iry = starty - (srx - SIZX + 1) / frxry + .5;
            srx = SIZX - 1;
            trap_write (ibit, ily, iry, srx, srx, flxly, 0.0);
            slx = slx + flxly * (iry - starty);
            trap_write (ibit, iry, endy, slx, srx, flxly, frxry);
            break;
        case 64:
            if ((debug & 8) && (trap_level & 128)) break;
            iry = starty - srx / frxry + .5;
            trap_write (ibit, starty, iry, slx, srx, flxly, frxry);
            break;
        case 128:
            if ((debug & 8) && (trap_level & 256)) break;
            iry = starty - (srx - SIZX + 1) / frxry + .5;
            trap_write (ibit, starty, iry, slx, srx, flxly, frxry);
            srx = SIZX - 1;
            trap_write (ibit, iry, endy, slx, srx, flxly, 0.0);
            break;
        default:
            trapmisd++;
            printf ("Missed trapezoid %d of type %d\n", trapmisd, ibit);
            printf ("y from %ld to %ld, left x %ld %ld, right x %ld %ld\n",
                starty, endy, slx, elx, srx, erx);
            break;
    }
    return;
}

/***************************************************************************
 *      Write out the trapezoid to trapbuf [trappnt++]
 ***************************************************************************/
trap_write (ibit, starty, endy, slx, srx, flxly, frxry)
    long        ibit, starty, endy, slx, srx;
    float                                       flxly, frxry;
{
    long  slope;
    float endlrx;

if ((starty > 255) || (endy < starty)) {
        printf ("Trap write failure at c.line 567, type %ld\n", ibit);
        printf ("%ld %ld %ld %ld %f %f\n", starty,endy,slx,srx,flxly,frxry);
    }
    if (fdiag) fprintf (fdiag, " %d  %ld %ld %ld %ld %f %f\n",
        (trappnt - 4) / 6, starty, endy, slx, srx, flxly, frxry);
    if ((trappnt + 16) > MAXTR) {
        printf ("trappnt overflow at c.line 573 %d\n", trappnt);
        return;
```

```
            endlrx = slx + flxly * (endy - starty);
            if (endlrx < 0   )  { flxly = starty - endy; flxly = slx / flxly; }
            if (SIZX < endlrx) { flxly = starty - endy; flxly = (slx - SIZX)/ flxly; }
            endlrx = srx + frxry * (endy - starty);
            if (endlrx < 0   )  { frxry = starty - endy; frxry = srx / frxry; }
            if (SIZX < endlrx) { frxry = starty - endy; frxry = (srx - SIZX)/ frxry; }
            trapbuf [trappnt++] = starty;
            trapbuf [trappnt++] = endy - starty;
            if ((flxly > 64) || (flxly < -64)) {
                trapbuf [trappnt++] = slx | 0x8000;
                slope = flxly * 32;
            }
            else {
                trapbuf [trappnt++] = slx;
                slope = flxly * 256;
            }
            if (slope >  32000) slope =  32000;
            if (slope < -32000) slope = -32000;
            trapbuf [trappnt++] = slope;
            if ((frxry > 64) || (frxry < -64)) {
                trapbuf [trappnt++] = srx | 0x8000;
                slope = frxry * 32;
            }
            else {
                trapbuf [trappnt++] = srx;
                slope = frxry * 256;
            }
            if (slope >  32000) slope =  32000;
            if (slope < -32000) slope = -32000;
            trapbuf [trappnt++] = slope;
            traphit++;
            if (debug & 256) printf ("%d %d %d %d %d %d\n", trapbuf [trappnt - 6],
                trapbuf [trappnt - 5], trapbuf [trappnt - 4], trapbuf [trappnt - 3],
                trapbuf [trappnt - 2], trapbuf [trappnt - 1]);
}

/*****************************************************************************
*       Convert points to the rotated set of co-ordinates
*****************************************************************************/
convert (lxy, ic, lx, ly)
    int ic;
    long lxy [], lx, ly;
{
    lxy [0] = lx + (ly - yref [ic]) * rotate [ic] + xoffset [ic];
    lxy [1] = ly - (lx - xref [ic]) * rotate [ic] + yoffset [ic];
}

/*****************************************************************************
*       Concatenate two strings temporarily (do not use twice in one C line)
*****************************************************************************/
char *ccat (str1, str2)
    char str1 [], str2 [];
{
    int i, j;
    static char strout [40];

if (debug & 128) printf ("Entering routine ccat\n");
    for (i = 0; i < 40; i++) if ((strout [i] = str1 [i]      ) == 0) break;
    for (j = i; j < 40; j++) if ((strout [j] = str2 [j - i]) == 0) break;
    return (lcase (strout));
}

/*****************************************************************************
*       Convert to lower case temporarily (do not use twice in one C line)
*****************************************************************************/
char *lcase (strin)
    char strin [];
{
    int i;
    static char strout [40];

if (debug & 128) printf ("Entering routine lcase\n");
    for (i = 0; i < 40; i++) {
        if ((strout [i] = strin [i]) == 0) break;
        if ((strout [i] >= 'A') && (strout [i] <= 'Z')) strout [i] += 'a'-'A';
    }
    return (strout);
}

/*****************************************************************************
*       Get the parameters entered on the command line
*****************************************************************************/
get_params (argc, argv)
    int argc;
    char *argv [];
{
    int i, j;

debug = 0;
    fdiag = 0;
    basename [0] = 0;
    trap_level = 511;
    for (i = 1; i < argc; i++) {
        if (argv [i] [0] == '-') {
```

```
            switch (argv [i] [1]) {
            case 'd': case 'D':
                debug = atoi (&argv [i] [2]);
                break;
            case 'f': case 'F':
                fdiag = fopen ("diagnost.cgv", "w");
                break;
            case 'l': case 'L':
                trap_level = atoi (&argv [i] [2]);
                break;
            case 's': case 'S':
                subext [0] = argv [i] [2];
                subext [1] = argv [i] [3];
                subext [2] = argv [i] [4];
                subext [3] = 0;
                break;
            default:
                printf ("Unrecognized switch %s as parameter %d\n",argv[i],i);
                break;
            }
        }
        else {
            for (j = 0; j < 10; j++)
                if (0 == (basename [j] = argv [i] [j]))
                    break;
            basename [j++] = '.';
            basename [j  ] =  0 ;
        }
    }
}

/*****************************************************************************
*       Initialize the system
*****************************************************************************/
initsys ()
{
    icnumber = maxic = 0;
    xmin = ymin = 0;
    xmax = ymax = 1000;
}
```

APPENDIX D

Listing 4

Copyright rights in this program and derivatives in both form and language nonetheless are vested in the assignee.

```
;*****************************************************************************
;       TITLE     SKYLINE.MPP                                                 *
;       DATE      9/16/85                                                     *
;       AUTHOR    K2 WELLES                                                   *
;       LANG      ASM320                                                      *
;       PHONE     518-387-7425                                                *
;       (C)       COPYRIGHT GENERAL ELECTRIC 1985                             *
;       ASM       SKYMPP SKYLINE.MPP SKYLINE.ASM                              *
;                 SKYASM +p SKYLINE                                           *
;                 SKYDEB                                                      *
;                 ,H                                                          *
;                 ,GP SKYLINE                                                 *
;                 0X21,E                                                      *
;                 .Q                                                          *
;       BATCH     SKL                                                         *
;***************************************************************************** include "sky320.h"

; define a few locations in internal memory
; these are predetermined variables
         .=64
ZERO:    DW    0                ; constant values
ONE:     DW    1
THREE:   DW    3
N511:    DW    511
MONE:    DW    -1
TMP:     DW    0                ; Temporary storage, never long term
BASADR:  DW    0x8000           ; Base memory address
WCOUNT:  DW    0                ; Word count for horizontal lines
LCOUNT:  DW    0                ; Line count for total lines in buffer
LINADR:  DW    0                ; Address of line params in data memory
SIZX:                           ; Size of x window for autocorrelation
WMEMAD:  DW    0                ; West word memory address
SIZY:                           ; Size of y window for autocorrelation
EMEMAD:  DW    0                ; East word memory address
STRX:                           ; Start of x window for autocorrelation
WL:      DW    0                ; West boundary of line to draw
STRY:                           ; Start of y window for autocorrelation
EL:      DW    0                ; East boundary of line to draw
PUTADR:                         ; Put address for autocorrelation
NL:      DW    0                ; North boundary of line to draw
GETADR:                         ; Get address for autocorrelation
```

```
SL:     DW      0               ; South boundary of line to draw
GETAD2:                         ; Get address for autocorrelation (dummy)
WI:     DW      0               ; West integer (WL/16)
SIZX2:                          ; Size of x window, counter
EI:     DW      0               ; East integer (EL/16)
AUTOLO:                         ; Low accumulator for autocorrelation
WB:     DW      0               ; West line end bit pattern
AUTOHI:                         ; High accumulator for autocorrelation
EB:     DW      0               ; East line end bit pattern
WBADR:  DW      WBITS           ; Address of west bit pattern lookup table
EBADR:  DW      EBITS           ; Address of east bit pattern lookup table
NEWCNT: DW      0x8000          ; New count to stuff on each falling edge
BITTST: DW      0x0200          ; Bit to test against for chunk boundary
XFERON: DW      0x0460          ; Value to load for dma transfer
RMEMAD: DW      0               ; Address counter
YCOUNT: DW      0               ; Trapezoid height counter
SLOPLL: DW      0               ; Left slope lower word
SLOPLU: DW      0               ; Left slope upper word
SLOPRL: DW      0               ; Right slope lower word
SLOPRU: DW      0               ; Right slope upper word
XLL:    DW      0               ; Left X position, lower word (upper in WL)
XRL:    DW      0               ; Right X position, lower word (upper in EL)

START   0x21
        LOAD    0

.=0x21
        B       BEGIN

;************************************************************************
;       TABLE OF AVAILABLE LIBRARY SUBROUTINES
;************************************************************************
LIBTBL: DW      LINELO          ; 1  Draw lines in buffer area at 9000
        DW      LINEHI          ; 2  Draw lines in buffer area at 9800
        DW      SK2IBM          ; 3  Convert from sky to IBM graphics format
        DW      SK3IBM          ; 4  Convert from sky to IBM square format
        DW      INITT           ; 5  Initialize for transfer
        DW      WRISE           ; 6  Await rising signal edge
        DW      WFALL           ; 7  Await falling signal edge and reset cnt
        DW      PIXD2S          ; 8  Copy a picture from DT2803 to SKY
        DW      WDWCPY          ; 9  Copy a window in 1000 to 0
        DW      AUTOCR          ; 10 Autocorrelate a N by M segment
        DW      MSKPIX          ; 11 Mask the picture to 6 bits
        DW      AUTOFS          ; 12 Fast autocorrelate a N by M segment
        DW      CLRMLO          ; 13 Clear memory at 9000
        DW      CLRMHI          ; 14 Clear memory at 9800
        DW      TRAPLO          ; 15 Draw trapezoids in buffer area at 9000
        DW      TRAPHI          ; 16 Draw trapezoids in buffer area at 9800
        DW      VRSION          ; 17 Return the version number in COMREG
        NUMRTS = . - LIBTBL EBITS:  DW      0x0000
        DW      0x0001
        DW      0x0003
        DW      0x0007
        DW      0x000F
        DW      0x001F
        DW      0x003F
        DW      0x007F
        DW      0x00FF
        DW      0x01FF
        DW      0x03FF
        DW      0x07FF
        DW      0x0FFF
        DW      0x1FFF
        DW      0x3FFF
        DW      0x7FFF WBITS:  DW      0xFFFF
        DW      0xFFFE
        DW      0xFFFC
        DW      0xFFF8
        DW      0xFFF0
        DW      0xFFE0
        DW      0xFFC0
        DW      0xFF80
        DW      0xFF00
        DW      0xFE00
        DW      0xFC00
        DW      0xF800
        DW      0xF000
        DW      0xE000
        DW      0xC000
        DW      0x8000

;************************************************************************
;       INITIALIZE
;************************************************************************
BEGIN:  LDPK    0               ; ram page 0
        LACK    0
        SACL    ZERO            ; ZERO = 0
        LACK    1
        SACL    ONE             ; ONE = 1
        LACK    3
        SACL    THREE           ; THREE = 3
        LAC     ONE,9           ; 512
```

```
                SUB     ONE,0           ; 511
                SACL    N511
                LAC     ZERO,0
                SUB     ONE,0
                SACL    MONE            ; MONE = -1
                LAC     ONE,10
                SUB     ONE,0
                LACK    WBITS
                SACL    WBADR           ; WBADR = WBITS address
                LACK    EBITS
                SACL    EBADR           ; EBADR = EBITS address
                LAC     ONE,9
                SACL    BITTST
                LAC     ONE,15
                SACL    NEWCNT
                LACK    0X46
                SACL    TMP
                LAC     TMP,4
                SACL    XFERON ;****************************************************************************
;       BRANCH TO ROUTINE NUMBER PASSED TO 320 FROM 8088 VIA COMREG
;****************************************************************************
FOREVR: OUT     ZERO,COMREG
        OUT     ZERO,STCREG     ; set up for 16 bit transfers
        OUT     XFERON,IOCREG CASE:   IN      TMP,COMREG      ; await a valid command
        LAC     TMP,0
        BLZ     CASE
        LACK    NUMRTS          ; number of valid subroutines
        SUB     TMP,0
        BLZ     CASE            ; invalid command
        OUT     TMP,COMREG      ; echo the command to show it is being
        LACK    LIBTBL - 1      ; acted upon.  load the offset
        ADD     TMP             ; add the command number
        TBLR    TMP             ; get the address of the subroutine
        LAC     TMP,0
        CALA                    ; call the subroutine ;****************************************************************************
;       RETURN FROM CALLED ROUTINE AND AWAIT COMREG CLEARED BY 8088
;****************************************************************************
ZLOOP:  IN      TMP,COMREG      ; wait for the COMREG to go to 0 before
        LAC     TMP,0           ; proceeding
        BNZ     ZLOOP
        B       FOREVR ;****************************************************************************
;       RETURN THE VERSION NUMBER AND SOFTWARE NUMBER
;****************************************************************************
VRSION: LACK    1               ; version number of SKYLINE
        ADD     THREE,8         ; SKYLINE number
        SACL    TMP
        OUT     TMP,COMREG
        RET ;****************************************************************************
;       LINELO/HI   Draw a line into 0x9000 or 0x9800 memory
;****************************************************************************
LINELO: LAC     ONE,15
        SACL    BASADR          ; BASADR = 0x8000
        LAC     ZERO,0
        SACL    LINADR          ; LINADR = 0x0000
        B       DRWL94

LINEHI: LAC     THREE,14
        SACL    BASADR          ; BASADR = 0xC000
        LAC     ONE,13
        SACL    LINADR          ; LINADR = 0x2000

DRWL94: OUT     LINADR,DMEMAD
        IN      LCOUNT,DMEMDA   ; Get the number of line parameters available LAC     LCOUNT,0
        BLEZ    QUIT            ; Exit if illegal line count present
        LACK    4
        ADD     LINADR,0
        SACL    LINADR DRWL1:  OUT     LINADR,DMEMAD   ; next params start at address in LINADR
        IN      WL,DMEMDA
        IN      NL,DMEMDA
        IN      EL,DMEMDA
        IN      SL,DMEMDA
        LAC     EL,0            ;******   TEMPORARY   *************************
        ADD     ONE,0
        SACL    EL              ; EL += 1 (correct for narrowing)
        LAC     LINADR,0
        ADD     ONE,2
        SACL    LINADR          ; LINADR = LINADR + 4

LAC     WL,12
        SACH    WI              ; WI = WL / 16
        LAC     EL,12
        SACH    EI              ; EI = EL / 16
```

```
        LACK    15
        AND     WL
        ADD     WBADR
        TBLR    WB              ; WB = west line end bit pattern
        LACK    15
        AND     EL
        ADD     EBADR
        TBLR    EB              ; EB = east line end bit pattern
        LAC     EI,0
        SUB     WI,0            ; EI - WI
        BZ      COLDRW          ; Column draw if EI = WI
        SUB     ONE
        SACL    WCOUNT          ; WCOUNT = EI - WI - 1
        LAC     NL,6
        ADD     WI,0
        ADD     BASADR,0
        SACL    WMEMAD          ; Calculate address of west line end
        LAC     NL,6
        ADD     EI,0
        ADD     BASADR,0
        SACL    EMEMAD          ; Calculate address of east line end
        LAC     SL,0
        SUB     NL,0
        SACL    TMP
        LAR     1,TMP LINLP3: OUT     WMEMAD,DMEMAD   ; data [WMEMAD] |= WB
        IN      TMP,DMEMDA
        LAC     TMP,0
        OR      WB
        SACL    TMP
        OUT     WMEMAD,DMEMAD
        OUT     TMP,DMEMDA LAR     0,WCOUNT        ; set up for long memory fill
        LARP    0
        BANZ    LINLP0
        B       LINLP1

LINLP0: OUT     MONE,DMEMDA     ; fill long memory
        BANZ    LINLP0

LINLP1: OUT     EMEMAD,DMEMAD   ; data [EMEMAD] |= EB
        IN      TMP,DMEMDA
        LAC     TMP,0
        OR      EB
        SACL    TMP
        OUT     EMEMAD,DMEMAD
        OUT     TMP,DMEMDA LAC     WMEMAD,0
        ADD     ONE,6
        SACL    WMEMAD          ; WMEMAD += 64
        LAC     EMEMAD,0
        ADD     ONE,6
        SACL    EMEMAD          ; EMEMAD += 64
        LARP    1
        BANZ    LINLP3          ; loop on AR 1

B       NXTLIN          ; loop to next line definition

COLDRW: LAC     WB,0            ; column draw, only one word in column used
        AND     EB
        SACL    WB              ; WB = WB & EB
        LAC     SL,0
        SUB     NL,0
        SACL    TMP
        LAR     0,TMP
        LARP    0               ; AR0 = SL - NL LAC     NL,6
        ADD     WI,0
        ADD     BASADR,0
        SACL    WMEMAD          ; Calculate address of west line end LINLP7: OUT     WMEMAD,DMEMAD   ; data [WMEMAD] |= WB
        IN      TMP,DMEMDA
        LAC     TMP,0
        OR      WB
        SACL    TMP
        OUT     WMEMAD,DMEMAD
        OUT     TMP,DMEMDA LAC     WMEMAD,0
        ADD     ONE,6
        SACL    WMEMAD          ; WMEMAD += 64
        BANZ    LINLP7          ; loop on AR0

NXTLIN: LAC     LCOUNT,0        ; loop on LCOUNT
        SUB     ONE,0
        SACL    LCOUNT
        BGZ     DRWL1

QUIT:   RET                     ; normal or abnormal exit through here
```

```
;************************************************************************
;     CLRMEM    Clear 32K bytes of ram starting at BASADR
;************************************************************************
CLRMLO: LAC     ONE,15
        SACL    BASADR          ; BASADR = 0x8000
        B       CLRMEM CLRMHI: LAC     THREE,14
        SACL    BASADR          ; BASADR = 0xC000

CLRMEM: OUT     BASADR,DMEMAD   ; Clear the pertinent memory
        LAR     0,N511          ; Largest number clearable
        LARP    0
DRWL95: OUT     ZERO,DMEMDA     ; Loop 32 times 512 for 16k X 16 clear
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        OUT     ZERO,DMEMDA
        BANZ    DRWL95
        RET ;************************************************************************
;     TRAPLO/HI   Draw a line into 0x9000 or 0x9800 memory
;************************************************************************
TRAPLO: LAC     ONE,15
        SACL    BASADR          ; BASADR = 0x8000
        LAC     ZERO,0
        SACL    LINADR          ; LINADR = 0x0000
        B       TRAP0

TRAPHI: LAC     THREE,14
        SACL    BASADR          ; BASADR = 0xC000
        LAC     ONE,13
        SACL    LINADR          ; LINADR = 0x2000

TRAP0:  OUT     LINADR,DMEMAD
        IN      LCOUNT,DMEMDA   ; Get the number of line parameters available LAC     LCOUNT,0
        BLEZ    QUIT            ; Exit if illegal line count present
        LACK    4
        ADD     LINADR,0
        SACL    LINADR TRAP1:  OUT     LINADR,DMEMAD   ; next params start at address in LINADR
        IN      NL,DMEMDA
        IN      YCOUNT,DMEMDA
        IN      WL,DMEMDA
        IN      SLOPLL,DMEMDA
        IN      EL,DMEMDA
        IN      SLOPRL,DMEMDA
        LAC     EL,0            ;****** TEMPORARY ************************
        ADD     ONE,0
        SACL    EL              ; EL += 1 (correct for narrowing)
TRAP15: LACK    6
        ADD     LINADR,0
        SACL    LINADR          ; LINADR = LINADR + 6
        LAC     YCOUNT
        ADD     ONE,0
        SACL    YCOUNT
        LACK    0
        SACL    XLL
        SACL    XRL             ; Zero the ls words of the left and right x
        LAC     ONE,15          ; ACC = 0x00008000
        AND     WL
        BZ      TRAP2           ; Branch if msb of left x is clear LAC     ONE,15
        SUB     ONE,0           ; ACC = 0x00007FFF
```

```
              AND       WL
              SACL      WL
              LAC       SLOPLL,11      ; Slope * 32
              B         TRAP3
TRAP2:        LAC       SLOPLL,8       ; Slope * 256
TRAP3:        SACH      SLOPLU,0
              SACL      SLOPLL LAC       ONE,15         ; ACC = 0x00008000
              AND       EL
              BZ        TRAP4          ; Branch if msb of right is clear LAC       ONE,15
              SUB       ONE,0          ; ACC = 0x00007FFF
              AND       EL
              SACL      EL
              LAC       SLOPRL,11      ; Slope * 32
              B         TRAP5
TRAP4:        LAC       SLOPRL,8       ; Slope * 256
TRAP5:        SACH      SLOPRU,0
              SACL      SLOPRL TRAP6:        LAC       WL,12
              SACH      WI             ; WI = WL / 16
              LAC       EL,12
              SACH      EI             ; EI = EL / 16
              LACK      15
              AND       WL
              ADD       WBADR
              TBLR      WB             ; WB = west line end bit pattern
              LACK      15
              AND       EL
              ADD       EBADR
              TBLR      EB             ; EB = east line end bit pattern
              LAC       EI,0
              SUB       WI,0           ; EI - WI
              BZ        TRAP20         ; Column draw if EI = WI
              SUB       ONE
              SACL      WCOUNT         ; WCOUNT = EI - WI - 1
              LAC       NL,6
              ADD       WI,0
              ADD       BASADR,0
              SACL      WMEMAD         ; Calculate address of west line end
              LAC       NL,6
              ADD       EI,0
              ADD       BASADR,0
              SACL      EMEMAD         ; Calculate address of east line end TRAP10:       OUT       WMEMAD,DMEMAD  ; data [WMEMAD] != WB
              IN        TMP,DMEMDA
              LAC       TMP,0
              OR        WB
              SACL      TMP
              OUT       WMEMAD,DMEMAD
              OUT       TMP,DMEMDA LAR       0,WCOUNT       ; set up for long memory fill
              LARP      0
              BANZ      TRAP11
              B         TRAP12

TRAP11:       OUT       MONE,DMEMDA    ; fill long memory
              BANZ      TRAP11

TRAP12:       OUT       EMEMAD,DMEMAD  ; data [EMEMAD] != EB
              IN        TMP,DMEMDA
              LAC       TMP,0
              OR        EB
              SACL      TMP
              OUT       EMEMAD,DMEMAD
              OUT       TMP,DMEMDA

B         NXTRAP

TRAP20:       LAC       WB,0           ; column draw, only one word in column used
              AND       EB
              SACL      WB             ; WB = WB & EB
              LAC       NL,6
              ADD       WI,0
              ADD       BASADR,0
              SACL      WMEMAD         ; Calculate address of west line end
              OUT       WMEMAD,DMEMAD  ; data [WMEMAD] != WB
              IN        TMP,DMEMDA
              LAC       TMP,0
              OR        WB
              SACL      TMP
              OUT       WMEMAD,DMEMAD
              OUT       TMP,DMEMDA NXTRAP:       ZALH      WL
              ADDS      XLL
              ADDH      SLOPLU
              ADDS      SLOPLL
              SACH      WL,0
              SACL      XLL
```

```
            ZALH    EL
            ADDS    XRL
            ADDH    SLOPRU
            ADDS    SLOPRL
            SACH    EL,0
            SACL    XRL

LAC     EL,0
            SUB     WL,0
            BLZ     ENDTRP

LAC     NL
            ADD     ONE,0
            SACL    NL              ; Up the y position by one count LAC     YCOUNT,0
            SUB     ONE,0
            SACL    YCOUNT
            BNZ     TRAP6

ENDTRP:     LAC     LCOUNT,0
            SUB     ONE,0
            SACL    LCOUNT
            BNZ     TRAP1

RET                     ; normal or abnormal exit through here

;**********************************************************************
;           SK2IBM   Convert sky format to IBM graphics card format
;**********************************************************************
SK2IBM:     LACK    6
            SACL    TMP
            LAC     TMP,12
            SACL    LINADR          ; LINADR = 0x6000, destination address OUT     ZERO,DMEMAD
            IN      BASADR,DMEMDA   ; BASADR = address of first word to convert
            CALL    SK20

OUT     ZERO,DMEMAD
            IN      BASADR,DMEMDA   ; BASADR = address of first word to convert
            LAC     ONE,6
            ADD     BASADR,0
            SACL    BASADR SK20:       LARK    1,99            ; AR1 = number of rows to convert SK21:       LARK    0,39            ; AR0 = number of words in a row to convert
            LARP    0               ; select AR0

SK22:       OUT     BASADR,DMEMAD
            LAC     BASADR,0
            ADD     ONE,0
            SACL    BASADR
            IN      TMP,DMEMDA      ; get the value to convert
            LACK    0
            SACL    WL              ; WL = 0, used as a temporary register
            ZALH    TMP             ; Get source word in high 16
            SACH    TMP,1           ; store value shifted left once
            BGEZ    CNVF
            LAC     ONE,8
            SACL    WL
CNVF:       ZALH    TMP
            SACH    TMP,1
            BGEZ    CNVE
            LAC     ONE,9
            OR      WL
            SACL    WL
CNVE:       ZALH    TMP
            SACH    TMP,1
            BGEZ    CNVD
            LAC     ONE,10
            OR      WL
            SACL    WL
CNVD:       ZALH    TMP
            SACH    TMP,1
            BGEZ    CNVC
            LAC     ONE,11
            OR      WL
            SACL    WL
CNVC:       ZALH    TMP
            SACH    TMP,1
            BGEZ    CNVB
            LAC     ONE,12
            OR      WL
            SACL    WL
CNVB:       ZALH    TMP
            SACH    TMP,1
            BGEZ    CNVA
            LAC     ONE,13
            OR      WL
            SACL    WL
CNVA:       ZALH    TMP
            SACH    TMP,1
            BGEZ    CNV9
```

```
            LAC     ONE,14
            OR      WL
            SACL    WL
CNV9:       ZALH    TMP
            SACH    TMP,1
            BGEZ    CNV8
            LAC     ONE,15
            OR      WL
            SACL    WL
CNV8:       ZALH    TMP
            SACH    TMP,1
            BGEZ    CNV7
            LAC     ONE,0
            OR      WL
            SACL    WL
CNV7:       ZALH    TMP
            SACH    TMP,1
            BGEZ    CNV6
            LAC     ONE,1
            OR      WL
            SACL    WL
CNV6:       ZALH    TMP
            SACH    TMP,1
            BGEZ    CNV5
            LAC     ONE,2
            OR      WL
            SACL    WL
CNV5:       ZALH    TMP
            SACH    TMP,1
            BGEZ    CNV4
            LAC     ONE,3
            OR      WL
            SACL    WL
CNV4:       ZALH    TMP
            SACH    TMP,1
            BGEZ    CNV3
            LAC     ONE,4
            OR      WL
            SACL    WL
CNV3:       ZALH    TMP
            SACH    TMP,1
            BGEZ    CNV2
            LAC     ONE,5
            OR      WL
            SACL    WL
CNV2:       ZALH    TMP
            SACH    TMP,1
            BGEZ    CNV1
            LAC     ONE,6
            OR      WL
            SACL    WL
CNV1:       ZALH    TMP
            SACH    TMP,1
            BGEZ    CNV0
            LAC     ONE,7
            OR      WL
            SACL    WL
CNV0:       OUT     LINADR,DMEMAD
            LAC     LINADR,0
            ADD     ONE,0
            SACL    LINADR
            OUT     WL,DMEMDA
            BANZ    SK22

LACK    88
            ADD     BASADR,0
            SACL    BASADR
            LARP    1
            BANZ    SK21

RET

;****************************************************************************
;           SK3IBM   Convert sky format to IBM graphics card format
;****************************************************************************
SK3IBM:     LACK    24
            SACL    EL              ; Square display on crt
            LACK    6
            SACL    TMP
            LAC     TMP,12
            SACL    LINADR          ; LINADR = 0x6000, destination address OUT     ZERO,DMEMAD
            IN      BASADR,DMEMDA   ; BASADR = address of first word to convert
            CALL    SK30
            OUT     ZERO,DMEMAD
            IN      BASADR,DMEMDA   ; BASADR = address of first word to convert
            LAC     ONE,6
            ADD     BASADR,0
            SACL    BASADR SK30:       LARK    1,99            ; AR1 = number of rows to convert
SK31:       LARK    0,19            ; AR0 = number of words in a row to convert
            LARP    0               ; select AR0
```

```
SK32:   OUT     BASADR,DMEMAD
        LAC     BASADR,0
        ADD     ONE,0
        SACL    BASADR
        IN      TMP,DMEMDA      ; get the value to convert
        LACK    0
        SACL    WL              ; WL = 0, used as a temporary register
        SACL    EL              ; EL = 0, used as a temporary register
        ZALH    TMP             ; Get source word in high 16
        SACH    TMP,1           ; store value shifted left once
        BGEZ    CNWF
        LAC     THREE,8
        SACL    WL
CNWF:   ZALH    TMP
        SACH    TMP,1
        BGEZ    CNWE
        LAC     THREE,10
        OR      WL
        SACL    WL
CNWE:   ZALH    TMP
        SACH    TMP,1
        BGEZ    CNWD
        LAC     THREE,12
        OR      WL
        SACL    WL
CNWD:   ZALH    TMP
        SACH    TMP,1
        BGEZ    CNWC
        LAC     THREE,14
        OR      WL
        SACL    WL
CNWC:   ZALH    TMP
        SACH    TMP,1
        BGEZ    CNWB
        LAC     THREE,0
        OR      WL
        SACL    WL
CNWB:   ZALH    TMP
        SACH    TMP,1
        BGEZ    CNWA
        LAC     THREE,2
        OR      WL
        SACL    WL
CNWA:   ZALH    TMP
        SACH    TMP,1
        BGEZ    CNW9
        LAC     THREE,4
        OR      WL
        SACL    WL
CNW9:   ZALH    TMP
        SACH    TMP,1
        BGEZ    CNW8
        LAC     THREE,6
        OR      WL
        SACL    WL
CNW8:   ZALH    TMP
        SACH    TMP,1
        BGEZ    CNW7
        LAC     THREE,8
        OR      EL
        SACL    EL
CNW7:   ZALH    TMP
        SACH    TMP,1
        BGEZ    CNW6
        LAC     THREE,10
        OR      EL
        SACL    EL
CNW6:   ZALH    TMP
        SACH    TMP,1
        BGEZ    CNW5
        LAC     THREE,12
        OR      EL
        SACL    EL
CNW5:   ZALH    TMP
        SACH    TMP,1
        BGEZ    CNW4
        LAC     THREE,14
        OR      EL
        SACL    EL
CNW4:   ZALH    TMP
        SACH    TMP,1
        BGEZ    CNW3
        LAC     THREE,0
        OR      EL
        SACL    EL
CNW3:   ZALH    TMP
        SACH    TMP,1
        BGEZ    CNW2
        LAC     THREE,2
        OR      EL
        SACL    EL
CNW2:   ZALH    TMP
        SACH    TMP,1
        BGEZ    CNW1
        LAC     THREE,4
        OR      EL
```

```
         SACL    EL
CNW1:    ZALH    TMP
         SACH    TMP,1
         BGEZ    CNW0
         LAC     THREE,6
         OR      EL
         SACL    EL
CNW0:    OUT     LINADR,DMEMAD
         LACK    2
         ADD     LINADR,0
         SACL    LINADR
         OUT     EL,DMEMDA
         OUT     WL,DMEMDA
         BANZ    SK32

LACK    108
         ADD     BASADR,0
         SACL    BASADR
         LARP    1
         BANZ    SK31

RET

INITT:   OUT     XFERON,IOCREG
         OUT     NEWCNT,AOUTAD
         RET

WRISE:   IN      TMP,IOCREG
         LAC     TMP,0
         AND     BITTST
         BZ      WRISE
         RET

WFALL:   IN      TMP,IOCREG
         LAC     TMP,0
         AND     BITTST
         BNZ     WFALL
         OUT     NEWCNT,AOUTAD
         RET

;***********************************************************************
;       PIXD2S  Load a picture from DT2803 into SKY low bytes
;***********************************************************************
PIXD2S:  LAC     ONE,12          ; 1 * 2 ^ 12 = 4096
         SACL    TMP
         OUT     TMP,AINADR      ; read in 256 * 240 bytes starting at 4096
         LACK    0x86            ; 0x0860 is DMA into SKY board
         SACL    TMP
         LAC     TMP,4
         SACL    TMP
         OUT     TMP,IOCREG      ; send the request
         RET ;***********************************************************************
;       WDWCPY  Copy a window to 0
;***********************************************************************
WDWCPY:  LACK    0
         SUB     ONE,2           ; 0 - 2 ^ 2 = -4 = fffc
         SACL    TMP
         OUT     TMP,DMEMAD
         IN      SIZX,DMEMDA     ; Get size x from fffc (9fff8)
         IN      SIZY,DMEMDA     ; Get size y from fffd (9fffa)
         IN      STRX,DMEMDA     ; Get start x from fffe (9fffc)
         IN      STRY,DMEMDA     ; Get start y from ffff (9fffe)
         LACK    0
         LACK    0               ; Dummies for memory test (12/11/85)
         LACK    0
         LACK    0
         LACK    0
         LACK    0
         LACK    0
         LACK    0
         SACL    PUTADR          ; Store 0 in put address
         LAC     ONE,12
         ADD     STRY,8
         ADD     STRX
         SACL    GETADR          ; Store 4096 + starty * 256 + startx in get
WDWC2:   LAC     GETADR,0
         SACL    GETAD2
         LAC     SIZX,0
         SACL    SIZX2

WDWC3:   OUT     GETAD2,DMEMAD
         IN      TMP,DMEMDA
         LACK    63
         AND     TMP
         SACL    TMP
         OUT     PUTADR,DMEMAD
         OUT     TMP,DMEMDA

LAC     GETAD2,0
         ADD     ONE,0
         SACL    GETAD2
         LAC     PUTADR,0
         ADD     ONE,0
```

```
            SACL    PUTADR
            LAC     SIZX2,0
            SUB     ONE,0
            SACL    SIZX2
            BNZ     WDWC3

LAC     GETADR,0
            ADD     ONE,8
            SACL    GETADR          ; GETADR += 256
            LAC     SIZY,0
            SUB     ONE,0
            SACL    SIZY
            BNZ     WDWC2

RET

;****************************************************************************
;       AUTOCR  Autocorrelate what is in 0 to x, y (found in fffe, ffff)
;****************************************************************************
AUTOCR:
            LACK    0
            SUB     ONE,2           ; 0 - 2 ^ 2 = -4 = fffc
            SACL    TMP
            OUT     TMP,DMEMAD
            IN      SIZX,DMEMDA     ; Get size x from fffc (9fff8)
            IN      SIZY,DMEMDA     ; Get size y from fffd (9fffa)
            IN      STRX,DMEMDA     ; Get start x from fffe (9fffc)
            IN      STRY,DMEMDA     ; Get start y from ffff (9fffe)
            LACK    0
            SACL    AUTOLO          ; Zero the autocorrelate accumulator
            SACL    AUTOHI          ; Zero the autocorrelate accumulator LACK    0
            SACL    PUTADR          ; Store 0 in put address
            LAC     ONE,12
            ADD     STRY,8
            ADD     STRX
            SACL    GETADR          ; Store 4096 + starty * 256 + startx in get AUTO2:      LAC     GETADR,0
            SACL    GETAD2
            LAC     SIZX,0
            SACL    SIZX2

AUTO3:      OUT     GETAD2,DMEMAD
            IN      TMP,DMEMDA
            LACK    63
            AND     TMP
            SACL    TMP
            LT      TMP             ; Place the pixel in the T register
            OUT     PUTADR,DMEMAD
            IN      TMP,DMEMDA
            MPY     TMP
            PAC                     ; Put product in acc
            ADDH    AUTOHI
            ADDS    AUTOLO
            SACH    AUTOHI,0
            SACL    AUTOLO LAC     GETAD2,0
            ADD     ONE,0
            SACL    GETAD2
            LAC     PUTADR,0
            ADD     ONE,0
            SACL    PUTADR
            LAC     SIZX2,0
            SUB     ONE,0
            SACL    SIZX2
            BNZ     AUTO3

LAC     GETADR,0
            ADD     ONE,8
            SACL    GETADR          ; GETADR += 256
            LAC     SIZY,0
            SUB     ONE,0
            SACL    SIZY
            BNZ     AUTO2

LACK    0
            SUB     ONE,1
            SACL    TMP
            OUT     TMP,DMEMAD
            OUT     AUTOLO,DMEMDA   ; Place the 32 bit result in fffe (9fffc)
            OUT     AUTOHI,DMEMDA   ; and ffff (9fffe)
            RET ;****************************************************************************
;       AUTOFS  Autocorrelate what is in 0 to x, y (found in fffe, ffff)
;****************************************************************************
AUTOFS:
            LACK    0
            SUB     ONE,2           ; 0 - 2 ^ 2 = -4 = fffc
            SACL    TMP
```

```
            OUT     TMP,DMEMAD
            IN      SIZX,DMEMDA     ; Get size x from fffc (9fff8)
            IN      SIZY,DMEMDA     ; Get size y from fffd (9fffa)
            IN      STRX,DMEMDA     ; Get start x from fffe (9fffc)
            IN      STRY,DMEMDA     ; Get start y from ffff (9fffe)
            LACK    0
            SACL    AUTOLO          ; Zero the autocorrelate accumulator
            SACL    AUTOHI          ; Zero the autocorrelate accumulator LACK    0
            SACL    PUTADR          ; Store 0 in put address
            LAC     ONE,12
            ADD     STRY,8
            ADD     STRX
            SACL    GETADR          ; Store 4096 + starty * 256 + startx in get
AUTF2:      OUT     GETADR,DMEMAD
            LAR     0,SIZX
            LARP    0
            LAC     *-,0

AUTF3:      IN      *,DMEMDA
            BANZ    AUTF3

OUT     PUTADR,DMEMAD
            LAR     0,SIZX
            LAC     *-,0
            ZALS    AUTOLO
            ADDH    AUTOHI
            IN      TMP,DMEMDA
            LT      TMP
            MPY     *-

AUTF4:      IN      TMP,DMEMDA
            LTA     TMP
            MPY     *
            BANZ    AUTF4

APAC
            SACL    AUTOLO
            SACH    AUTOHI,0

LAC     GETADR,0
            ADD     ONE,8
            SACL    GETADR
            LAC     PUTADR,0
            ADD     SIZX,0
            SACL    PUTADR
            LAC     SIZY,0
            SUB     ONE,0
            SACL    SIZY
            BNZ     AUTF2

LACK    0
            SUB     ONE,1
            SACL    TMP
            OUT     TMP,DMEMAD
            OUT     AUTOLO,DMEMDA   ; Place the 32 bit result in fffe (9fffc)
            OUT     AUTOHI,DMEMDA   ; and ffff (9fffe)
            RET ;****************************************************************
;       MSKPIX  Mask a picture to 6 bits only
;****************************************************************
MSKPIX: CALL    SET64       ; Set up for multiple 64 word operations MSK1:   CALL    GET64       ; Get a set of 64 words
MSK2:   LACK    63          ; Use only the low 6 bits of each word
        AND     *
        SACL    *
        BANZ    MSK2

CALL    PUT64       ; Put the words back out again
        DNZ     MSK1
        RET ;****************************************************************
;       SET64   Subroutine to set up for GET64
;****************************************************************
SET64:  LAC     ONE,12      ; ACC = 4096
        SUB     ONE,6       ; ACC = 4032
        SACL    RMEMAD
        LAC     ONE,10      ; ACC = 1024
        SUB     ONE,6       ; ACC = 960
        SACL    LCOUNT
        RET ;****************************************************************
;       GET64   Subroutine to load 64 bytes of external ram into
;               internal ram, advancing needed counters and selecting AR
;****************************************************************
GET64:  LACK    64
        ADD     RMEMAD,0
        SACL    RMEMAD       ; RMEMAD = RMEMAD + 64
        OUT     RMEMAD,DMEMAD ; set up the external address register
```

```
            LARK      0,63              ; ARO = 63
            LARP      0                 ; select ARO GET1:       IN        *-,DMEMDA         ; load bytes downward
            IN        *-,DMEMDA
            IN        *-,DMEMDA
            IN        *,DMEMDA          ; note: no decrement
            BANZ      GET1

LARK      0,63              ; ARO = 63
            RET

;*************************************************************************
;           PUT64     Subroutine to store 64 bytes of internal ram into
;                     external ram, advancing needed counters and selecting AR
;*************************************************************************
PUT64:      OUT       RMEMAD,DMEMAD
            LARK      0,63              ; ARO = 63
            LARP      0                 ; select ARO PUT1:       OUT       *-,DMEMDA         ; store bytes downward
            OUT       *-,DMEMDA
            OUT       *-,DMEMDA
            OUT       *,DMEMDA          ; note: no decrement
            BANZ      PUT1

LAC       LCOUNT,0
            SUB       ONE,0
            SACL      LCOUNT
            RET
```

The invention claimed is:

1. An adaptive method of providing high density interconnections among a plurality of integrated circuits on a substrate, said method comprising the steps of:
generating an artwork representation for the interconnections among said integrated circuits at predetermined ideal positions and orientations on said substrate;
determining the actual position and orientation of each of said integrated circuits on said substrate;
modifying said artwork representation for said interconnections among said integrated circuits to properly interconnect at least two of said integrated circuits in their actual positions and orientations, wherein said at least two integrated circuits are not in their ideal positions and orientations; and
forming high density interconnections among said integrated circuits using said modified artwork representation.

2. The adaptive lithography system according to claim 1 wherein:
said integrated circuits are individual chips separate from said substrate and fixed to said substrate.

3. The method according to claim 1 wherein said predetermined ideal positions and orientations and the locations of connection pads on each integrated circuit are stored in a first data base and the step of generating an artwork representation comprises the steps of:
providing a printed circuit layout of metallized conducting paths from said positions, orientations and connection pad locations and a list of the required connections among said connection pads of said integrated circuits; and
storing a representation of said printed circuit layout in a second data base decribing an interconnection structure for providing said high density interconnections among said integrated circuits in their ideal positions and orientations.

4. The method according to claim 3 wherein the step of storing is performed by storing a vector representation of said printed circuit layout in said second data base.

5. The method according to claim 3 wherein the step of determining comprises the steps of:
aligning an image of each of said integrated circuits in an image field of said substrate;
comparing each of said images of said integrated circuits with said predetermined ideal positions and orientation of said each integrated circuit on said substrate; and
calculating an offset and rotation for each of said integrated circuits based on said comparing step.

6. The method according to claim 5 wherein:
said step of aligning includes the step of generating a third data base describing the actual locations of predetermined features of each of said integrated circuits with respect to said substrate and wherein said step of comparing compares entries in said first and third data bases.

7. The method accoding to claim 6 wherein said modifying step comprises the step of producing a fourth data base by altering said second data base according to said calculated offset and rotation for each of said integrated circuits to produce a fourth data base storing a vector representation of the modified artwork.

8. The method according to claim 7 wherein said forming step is comprises the steps of:
converting the vector representation of the modified artwork in said fourth data base to a bit mapped representation of said modified artwork; and
controlling a raster scanned laser beam in a metallized circuit forming system in accordance with said bit mapped representation of said modified artwork.

9. An adaptive lithography system for providing high density interconnections of integrated circuits on a substrate, said system comprising:
memory means for storing in a first data base an artwork representation for the interconnections among said integrated circuits at predetermined ideal positions and orientations on said substrate;
imaging means for determining the actual position and orientation of each of said integrated circuits on said substrate;
computing means responsive to said memory means and said imaging means for modifying said artwork representation to match the actual position and orientation of each of said integrated circuits and for storing a modified artwork representation as a second data base in said memory means; and laser lithography means controlled by said modified artwork representation in said second data base for forming high density interconnections among said integrated circuits.

10. The adaptive lithography system according to claim 9 wherein:

said integrated circuits are individual chips separate from said substrate and fixed to said substrate.

11. The adaptive lithography system according to claim 9 wherein the representations in said first and second data bases are vector representations, said system further comprising conversion means for converting the vector representation in said second data base to a bit mapped representation used to control said laser lithography means.

12. The adaptive lithography system according to claim 11 wherein said laser lithography means comprises:

a direct writing laser producing a laser beam;

scanning means for scanning said laser beam in a raster on said substrate; and modulating means responsive to said bit mapped representation for modulating said laster beam as it is raster scanned on said substrate so as to define said interconnections according to said modified artwork representation.

13. The adaptive lithography system according to claim 12 further comprising:

alignment means for accurately determining the position of said scanning means at all times during scanning; and said computing means being responsive to said alignment means for controlling said scanning means to accurately position said laser beam at points as it is raster scanned on said substrate.

14. The adaptive lithography system according to claim 13 wherein said scanning means comprises:

deflecting means for deflecting said laser beam in a first direction; and displacement means carrying said substate for displacing said substrate in at least a second direction at an angle to said first direction; and wherein said alignment means comprises:

an alignment laser, graticule and photodiode, said alignment laser producing a light beam deflected by said deflecting means the deflection of which is sensed by said graticule and photodiode; and said computing means being responsive to said photodiode and said imaging means.

* * * * *